(12) United States Patent
Ren et al.

(10) Patent No.: US 11,651,194 B2
(45) Date of Patent: May 16, 2023

(54) LAYOUT PARASITICS AND DEVICE PARAMETER PREDICTION USING GRAPH NEURAL NETWORKS

(71) Applicant: NVIDIA Corp., Santa Clara, CA (US)

(72) Inventors: Haoxing Ren, Austin, TX (US); George Kokai, Cupertino, CA (US); Ting Ku, San Jose, CA (US); Walker Joseph Turner, Raleigh, NC (US)

(73) Assignee: NVIDIA Corp., Santa Clara, CA (US)

( * ) Notice: Subject to any disclaimer, the term of this patent is extended or adjusted under 35 U.S.C. 154(b) by 463 days.

(21) Appl. No.: 16/859,585

(22) Filed: Apr. 27, 2020

(65) Prior Publication Data

US 2021/0158127 A1 May 27, 2021

Related U.S. Application Data

(60) Provisional application No. 62/941,391, filed on Nov. 27, 2019.

(51) Int. Cl.
*G06F 16/901* (2019.01)
*G06F 17/16* (2006.01)
*G06N 3/045* (2023.01)

(52) U.S. Cl.
CPC ......... *G06N 3/045* (2023.01); *G06F 16/9024* (2019.01); *G06F 17/16* (2013.01)

(58) Field of Classification Search
CPC .... G06F 30/323; G06F 30/367; G06F 30/398; G06F 30/3308; G06F 30/3323
USPC .................................................... 726/15, 17
See application file for complete search history.

(56) References Cited

U.S. PATENT DOCUMENTS

| | | | |
|---|---|---|---|
| 5,045,804 | A | 9/1991 | Sugawara et al. |
| 5,600,187 | A | 2/1997 | El-Hamamsy et al. |
| 6,269,763 | B1 | 8/2001 | Woodland |
| 6,275,395 | B1 | 8/2001 | Inn et al. |
| 6,281,731 | B1 | 8/2001 | Fifield et al. |
| 6,414,519 | B1 | 7/2002 | Abernathy |
| 6,498,751 | B2 | 12/2002 | Ordonez et al. |
| 8,816,748 | B2 | 8/2014 | Kumar et al. |
| 9,024,678 | B2 | 5/2015 | Cavalotto et al. |
| 9,135,453 | B2 | 9/2015 | Shen-Orr et al. |
| 9,158,316 | B2 | 10/2015 | Theiler |
| 9,509,707 | B2 | 11/2016 | Patne et al. |
| 9,721,093 | B2 | 8/2017 | Poornachandran et al. |
| 9,755,822 | B2 | 9/2017 | Han et al. |
| 9,774,614 | B2 | 9/2017 | Patne et al. |
| 9,787,171 | B2 | 10/2017 | Fort |
| 9,812,954 | B1 | 11/2017 | Kose et al. |
| 9,891,639 | B2 | 2/2018 | Fort et al. |
| 9,970,986 | B2 | 5/2018 | Hampel et al. |
| 10,042,380 | B1 | 8/2018 | Hung et al. |

(Continued)

OTHER PUBLICATIONS

Oleg Garitselov1; Fast-Accurate Non-Polynomial Metamodeling for nano-CMOS PLL Design Optimization; IEEE:2012; pp. 317-321.*

(Continued)

*Primary Examiner* — Monjur Rahim
(74) *Attorney, Agent, or Firm* — Rowan TELS LLC

(57) ABSTRACT

A graph neural network to predict net parasitics and device parameters by transforming circuit schematics into heterogeneous graphs and performing predictions on the graphs. The system may achieve an improved prediction rate and reduce simulation errors.

17 Claims, 17 Drawing Sheets

| type | Aggregation |
|---|---|
| GCN | $h_i^{(l+1)} = \sigma\left(b^{(l)} + \sum_{j \in N(i)} \frac{1}{c_{ij}} W^{(l)} h_j^{(l)}\right)$ |
| GraphSage | $h_{N(i)}^{(l+1)} = \text{mean}\left(\{h_j^{(l)}, \forall j \in N(i)\}\right)$ <br> $h_i^{(l+1)} = \sigma\left(W \cdot \text{concat}(h_i^{(l)}, h_{N(i)}^{(l+1)}) + b^{(l)}\right)$ <br> $h_i^{(l+1)} = h_i^{(l+1)} / \|h_i^{(l+1)}\|_2$ |
| RGCN | $h_{N(i)}^{(l+1)} = \sum_{r \in R} \sum_{j \in N^r(i)} \frac{1}{c_{i,r}} W_r^{(l)} h_j^{(l)}$ <br> $h_i^{(l+1)} = \sigma(h_{N(i)}^{(l+1)} + W_0^{(l)} h_i^{(l)})$ |
| GAT | $e_{ij}^l = \vec{a}^T \text{concat}(W^{(l)} h_i^l, W^{(l)} h_j^l)$ <br> $\alpha_{ij}^l = \text{softmax}_i\left(\text{LeakyReLU}(e_{ij}^l)\right)$ <br> $h_i^{(l+1)} = \sigma\left(\sum_{j \in N(i)} \alpha_{ij}^l W^{(l)} h_j^{(l)}\right)$ |

(56) References Cited

U.S. PATENT DOCUMENTS

| | | |
|---|---|---|
| 10,389,519 B2 | 8/2019 | Cheng et al. |
| 10,423,207 B2 | 9/2019 | Reed et al. |
| 10,958,414 B2 | 3/2021 | Stark |
| 11,227,190 B1* | 1/2022 | Li .................... G06N 3/04 |
| 11,283,349 B2 | 3/2022 | Kudva et al. |
| 11,348,000 B1* | 5/2022 | Ding ................ G06N 3/08 |
| 2005/0275464 A1 | 12/2005 | Filoramo et al. |
| 2007/0094623 A1* | 4/2007 | Chen ............ G01R 31/31721 716/139 |
| 2016/0190988 A1 | 6/2016 | Lin et al. |
| 2018/0006638 A1 | 1/2018 | Chen et al. |
| 2019/0007223 A1 | 1/2019 | Vaidya et al. |
| 2019/0121928 A1* | 4/2019 | Wu .................. G06F 30/398 |
| 2020/0151288 A1* | 5/2020 | Ma ................... G06F 30/327 |
| 2020/0210805 A1* | 7/2020 | Drozdowski ........ G06N 7/00 |
| 2020/0302250 A1* | 9/2020 | Chu ................... G06F 30/13 |
| 2020/0327417 A1* | 10/2020 | Xie ................... G06F 30/367 |
| 2021/0334411 A1 | 10/2021 | Nedovic et al. |
| 2022/0004875 A1* | 1/2022 | Koike-Akino ....... G06N 3/0472 |
| 2022/0027546 A1* | 1/2022 | Ren .................... G06N 3/126 |
| 2022/0058466 A1* | 2/2022 | Yang ................... G06N 3/08 |
| 2022/0245425 A1* | 8/2022 | Sheikh ................ G06N 3/0427 |

OTHER PUBLICATIONS

Debayan Das et al, EM and Power SCA-Resilient AES-256 in 65nm CMOS Through >350x Current-Domain Signature Attenuation, IEEE ISSCC 2020, Feb. 19, 2020.

Carlos Tokunaga et al. "Secure AES Engine with Local switched-capacitor current equalizer", IEEE Solid State Circuits Conference (ISSCC), 2009, pp. 64-65.

Girish B, Ratanpal et al. "An On-Chip Signal Suppression Countermeasure to Power Analysis Attacks", IEEE Transactions on dependable and secure computing, Jul.-Sep. 2004, pp. 179-189.

Radu Muresan et al. "Protection Circuit against Differential Power Analysis Attacks for Smart Cards", IEEE Transactions on Computers, vol. 57, No. 11, p. 1540-1549, Nov. 2008.

\* cited by examiner

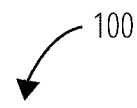

| type | Aggregation |
|---|---|
| GCN | $h_i^{(l+1)} = \sigma(b^{(l)} + \sum_{j \in N(i)} \frac{1}{c_{ij}} W^{(l)} h_j^{(l)})$ |
| GraphSage | $h_{N(i)}^{(l+1)} = mean\left(\{h_j^{(l)}, \forall j \in N(i)\}\right)$ <br> $h_i^{(l+1)} = \sigma\left(W \cdot concat(h_i^{(l)}, h_{N(i)}^{(l+1)} + b^{(l)})\right)$ <br> $h_i^{(l+1)} = h_i^{(l+1)} / \|h_i^{(l+1)}\|_2$ |
| RGCN | $h_{N(i)}^{(l+1)} = \sum_{r \in R} \sum_{j \in N^r(i)} \frac{1}{c_{i,r}} W_r^{(l)} h_j^{(l)}$ <br> $h_i^{(l+1)} = \sigma(h_{N(i)}^{(l+1)} + W_0^{(l)} h_i^{(l)})$ |
| GAT | $e_{ij}^l = \vec{a}^T concat(W^{(l)} h_i^l, W^{(l)} h_j^l)$ <br> $\alpha_{ij}^l = softmax_i\left(LeakyReLU(e_{ij}^l)\right)$ <br> $h_i^{(l+1)} = \sigma\left(\sum_{j \in N(i)} \alpha_{i,j} W^{(l)} h_j^{(l)}\right)$ |

FIG. 1

Algorithm 1 Relational GraphSage with ATtention (RGSAT) Model

Require: Graph $G(V, E)$, node types $T_N$, edge types $T_E$, node type mapping $\phi: V \rightarrow T_N$, edge type mapping $\psi: E \rightarrow T_E$, node features $\{h_i, \forall i \in V\}$, depth $L$, number of attention head $K$

Output: final graph embedding $Z = \{z_i, \forall i \in V\}$

1: for node type $t \in N_T$ do
2: $\quad h_i^{(0)} \leftarrow W_t h_i, \forall \phi(i) = t$ $\quad \triangleright$ type specific transformation to create common feature space
3: end for
4: for $l \leftarrow 0$ to $L - 1$ do
5: $\quad$ for $t \in E_T$ do
6: $\quad\quad$ for $k \leftarrow 1$ to $K$ do
7: $\quad\quad\quad$ for $\text{edge}(i,j) \in \{\text{edge}, \forall \psi(\text{edge}) = t\}$ do
8: $\quad\quad\quad\quad e_{ij} \leftarrow a^T \text{concat}(W_{t,k}^{(l)} h_i^{(l)}, W_{t,k}^{(l)} h_j^{(l)})$ $\quad \triangleright$ compute attention for edge type $t$ and $k^{th}$ attention head
9: $\quad\quad\quad\quad \alpha_{ij} \leftarrow \text{softmax}_j(\text{LeakyReLU}(e_{ij}))$
10: $\quad\quad\quad$ end for
11: $\quad\quad\quad h_{t,k}^{l,k} \leftarrow \sum_{j \in N_t(i)} \alpha_{ij} W_{t,k}^{(l)} h_j^{(l)}, \forall i \in N$ $\quad \triangleright$ aggregate the attention weighted neighbor embeddings
12: $\quad\quad$ end for
13: $\quad\quad h_{t,i}^l \leftarrow \frac{\sum_{k \in K} h_{t,i}^{l,k}}{K}, \forall i \in N$ $\quad \triangleright$ take a mean from all attention heads
14: $\quad$ end for
15: $\quad h_i \leftarrow \sum_{t \in E_T} h_{t,i}^l, \forall i \in N$ $\quad \triangleright$ Aggregate over different edge types
16: $\quad h_i^{(l+1)} \leftarrow \sigma \left( W^{(l)} \cdot \text{concat}(h_i^{(l)}, h_i) + b^{(l)} \right)$ $\quad \triangleright$ concatenate with previous layer feature and apply weight
17: end for
18: $Z \leftarrow \{z_i = h_i^{(L)}, \forall i \in V\}$

FIG. 5

---
Algorithm 2 Ensemble Modeling For Net Parasitics Capacitance
---
Require: a list of $K$ models $M_i$, and max prediction value $v_i$, $i \in (1,..,K)$, $v_0 ¡ v_1 ¡ v_2 ... ¡ v_K$, and net $n$
Output: prediction $p(n)$ for net $n$
 1: $p(n) \leftarrow M_1(n)$
 2: for $i \leftarrow 2$ to $K$ do
 3:     if $M_i(n) ¿ v_(i-1)$ then
 4:         $p(n) \leftarrow M_i(n)$
 5:     end if
 6: end for
---

LAYOUT PARASITICS AND DEVICE PARAMETER PREDICTION USING GRAPH NEURAL NETWORKS

CROSS REFERENCE TO RELATED APPLICATIONS

This application claims priority and benefit under 35 USC 119(e) to U.S. application Ser. No. 62/941,391, filed on Nov. 27, 2019, the contents of which are incorporated herein by reference in their entirety.

This invention was made with government support under the Intelligent Design of Electronic Assets (IDEA) program, DARPA contract TIA #HR0011-18-3-0010 awarded by the Defense Advanced Research Projects Agency (DARPA). The government has certain rights in the invention.

BACKGROUND

Layout-dependent parasitics and device parameters impact integrated circuit performance and are often the cause of slow convergences between schematic and layout designs. Circuit designers typically estimate parasitics from past experience, resulting in variability between designers and the potential for inaccuracies.

The dependency of net parasitics and physical device parameters on circuit layout increases in situations in which accurate evaluation of circuit performance cannot be achieved until after layout is complete. There are two main benefits to accurately predicting these variables before starting the layout process.

First, net parasitics and layout-dependent device parameters may degrade circuit performance. A designer may perform an iterative process to adjust device sizes post-layout to enhance performance or reduce parasitic effects, a process that can potentially take numerous iterations.

Second, parasitic and device parameters are important factors to include within parasitic-aware circuit layout techniques. An accurate predictor may facilitate identification of designs that represent an improved post-layout structure.

Previous approaches build estimated layouts of each device and calculate device geometries accordingly. They also may apply a linear regression model to estimate parasitic capacitance based on the device parameters connected to each net. The accuracy of this type of approach largely depends on the estimation accuracy for maximal transistor series (MTS) in the net. There are two drawbacks of this approach. First, the MTS estimation is difficult to perform prior to layout. Thus, designers may need to manually identify MTS groupings within the circuit. Second, the layout construction approach typically applies simplified design rules targeting standard (available in design software libraries) logic cells. These circuits may relatively small compared to analog and mixed-signal designs, where layout cannot be easily constructed with simplified rules.

Graph neural networks (GNNs) are a neural network architecture for machine learning on graphs, with conventional applications such as social networking and scene labeling. Graph neural networks assign node and edge features on a graph and share these features with neighbor nodes through message passing. "Neighbor" refers to a node in a graph, or N-adjacent, meaning adjacent within N hops from the node. One popular type of GNN is the graph convolutional network (GCN). "Graph convolutional network" refers to refers to a class of neural network architectures for processing inputs taking the form of graph structures. GCNs perform message passing in three steps: message sending, message reduction, and node transformation. Graph convolutional networks perform neighbor message passing to nodes in parallel. The resulting node features in a particular network layer become the output of that layer. The output of each node depends on assigned features and also the node's connectivity with its neighbors. Thus, graph neural networks learn parameters from input feature data as well as structure (connectivity) of the input graph.

Graph neural networks embody deep learning on graphs. Features of graph neural networks include embedding and neighbor aggregation. Embedding involves generating vectors to represent graph nodes, edges, or subgraphs. Neighbor aggregation aggregates information from a node's local (e.g., 1-hop, 2-hop . . . ) neighborhood, which is similar in some respects to the convolution processing performed on neighboring image pixels in Convolution Neural Networks (CNN). Unlike networks using methods such as Deep-walk and node2vec, which map nodes to embeddings using lookup tables, graph neural networks may be applicable to graphs that have not previously been processed by the network, because they directly incorporate graph structure into the learning algorithm.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 1 depicts aggregation algorithms 100 for common graph neural network models.

FIG. 5 depicts a graph neural network embedding algorithm 500 in accordance with one embodiment.

DETAILED DESCRIPTION

Figure 2:
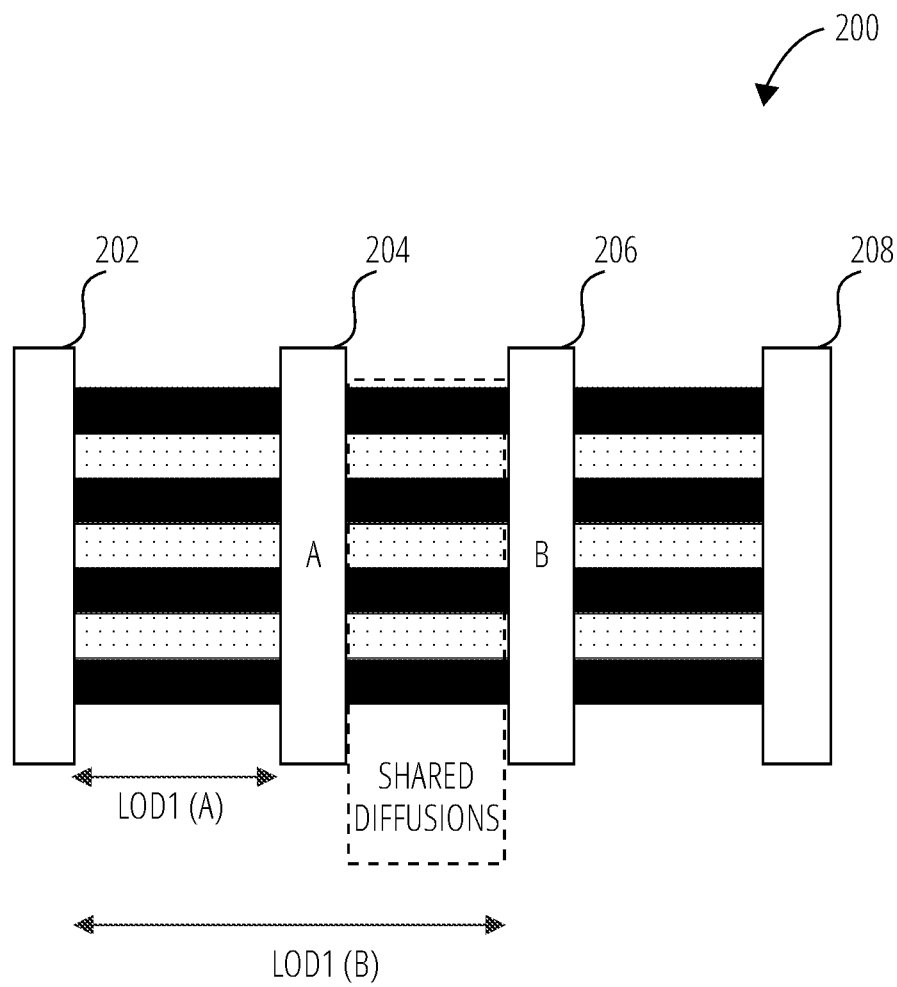
FIG. 2 depicts a FinFET layout 200 in accordance with one embodiment.

Embodiments of layout parasitic prediction techniques are described that utilize inherent graph structure of circuits.

Machine learning is applied to learn and provide parasitic prediction from the circuit structure represented as a graph. A graph neural network is trained to generate predictions of layout parasitics and device parameters. The predicted parasitics may be applied to reduce errors in circuit operation. The graph neural network utilized a heterogeneous graph with heterogeneous node and edge types. An ensemble modeling method may be utilized to improve prediction accuracy, particularly for parasitic capacitance.

Examples of the layout parasitics that may be predicted are net parasitic capacitance and net parasitic resistance. The device parameters that may be predicted include device layout geometry parameters such as diffusion area and perimeters, and Layout Dependent Effect (LDE) parameters such as layout-to-diffusion edge distances.

A GraphSage algorithm may provide improved performance over graph convolutional networks. The graph produced by transforming circuit schematics is heterogeneous with different types of nodes, such as net nodes and various types of device nodes (transistors, resistors, capacitors, etc.). Each type of node has its own feature dimensions. There are also different edge relation types between different node types, e.g., net→transistor$_{gate}$, net→transistor$_{source}$, etc. The heterogeneous graph may thus encode information beyond that available in a homogeneous graph.

FIG. 1 depicts aggregation algorithms 100 for common graph neural network models. There are four widely used graph neural network models: graph convolutional network (GCN), GraphSage, Relational GCN (RGCN), and Graph Attention Network (GAT). These models differ in how neighboring information is aggregated.

In FIG. 1:

$$h_i^{(l)} \in \mathbb{R}^F$$

is the embedding for layer l with F dimensions, and $$h_i^{(l+1)}$$

is the updated embedding for layer l+1. N(i) is the neighbor set of node i, and $c_{ij}$ is equal to the product of the square root of node degrees:

$$\sqrt{|N(i)|}\sqrt{|N(j)|}$$

The symbol σ is an activation, norm is a normalization function, b(l) is the bias of each layer, $N^r(i)$ is the neighbor set of node i with respect to relation r, $c_{i,r}$ is the normalizer equal to $|N^r(i)|$, W0 is the self-loop weight, $W_r$ is the weight for relation r, $\alpha_{i,j}$ is the learned attention between node i and j, and the attention matrix is given by $$\vec{a} = \mathbb{R}^F \times \mathbb{R}^F \to \mathbb{R}$$

Graph convolutional networks and GraphSage both leverage a convolutional mean aggregator to approximate localized spectral filters. One difference between GraphSage and a graph convolutional network is that GraphSage performs a concatenation of a previous embedding with the aggregated neighbor embeddings. This concatenation is similar to the "skip connection" operation between the different layers of the GraphSage algorithm.

For a graph with multiple relational edges, Relational GCN (RGCN) may be utilized to distinguish among the relational edges. RGCN applies different weight matrices to different relational edge groups and aggregates each group independently. Graph Attention Network (GAT) utilizes self-attention processing, which can be applied in sequence models to replace the mean neighborhood aggregator used in other models. It enables different weights ("importance") to be associated with different neighbors, thereby increasing the modeling capacity. Analyzing the learned attentional weights may also help model interpretability. The features of GraphSage, GAT, etc. have not typically been mixed and matched in manners that can exploit the heterogeneous graph structures. Thus these conventional graph neural network models excepting RGCN assume the graph is homogeneous, i.e., the graph comprises a single node type and a single edge type. RGCN may utilize graphs with different edge types, but not different node types.

FIG. 2 depicts a FinFET layout 200. The FinFET layout 200 comprises a dummy gate 202, a gate 204, a gate 206, and a dummy gate 208.

The transistor's geometric parameters and layout-dependent effect (LDE) parameters may be predicted as described in additional detail below. Transistor geometric parameters include diffusion areas and perimeters for both source diffusion and drain diffusion. Depending on whether two adjacent devices share diffusion or not, the source and drain diffusion area and perimeters may vary. For example, the source diffusion area of the gate 204 on the left is twice the area as its drain diffusion area because the drain diffusion area is shared with the gate 206 on the right.

Layout-dependent effects (LDEs) may impair device reliability or performance or both. An example of potentially impactful LDE parameters are length of diffusion (LOD) parameters. In FIG. 2 the LOD parasitics (LOD1) represent the distance from the poly to the left edge of the diffusion area. The LOD1 of device A is different from that of B. For transistors with multiple fingers, LOD parameters of each finger are averaged to represent values for the whole transistor. There are multiple ways of averaging, which result in multiple potential LOD parameters for each transistor. Net parasitics are capacitance and resistance introduced by the interconnects in the layout. There are multiple ways to estimate parasitic capacitance and resistance from the layout. For pre-layout simulation, may be efficient to use a lumped sum capacitance on each net. Therefore, the lumped sum parasitic capacitance for each net is extracted. Net parasitic resistance may be more complicated to model than net parasitic capacitance. Each net may have a different layout topology, which would create a different net resistance structure. Different features are extracted from the schematic for each type of device and net. Table 1 lists device parameters that may be predicted, such as diffusion areas and parasitics. Table 2 lists input features that may be utilized by the new graph neural network embodiments described herein to generate parasitic predictions.

TABLE 1

| Type | Parameters | Meaning |
|---|---|---|
| transistor | LODx | x = (1 . . . 8), eight LOD parameters |
|  | as, ad | source and drain diffusion areas |
|  | ps, pd | source and drain diffusion perimeters |
| net | cap | net parasitic capacitance |
|  | res | net parasitic resistance |

TABLE 2

| Type | Features | Meaning |
|---|---|---|
| transistor and transistor$_{thick}$ | L | gate poly length |
|  | NF | number of fingers |
|  | NFIN | number of FINS |
|  | MULTI | number of copies (multiplier) |
| resistor | L | length of resistor |
| capacitor | MULTI | multiplier |

TABLE 2-continued

| Type | Features | Meaning |
|---|---|---|
| diode | NF | number of fingers |
| BJT | 1 | constant |
| net | N | net fanout |

A FINFET transistor may be constructed with multiple fins (finlike protrusions of the source/drain regions on the substrate) and fingers (elemental transistor-like structure) which may impact the structure and dimensions of the FINFET on chip. The number of fingers may determine how many layers of poly (having gate poly length L) are used to construct the FINFET. Each finger may be thought of as a separate transistor, but by sharing diffusion, they may comprise one multi-finger transistor overall. Transistors may include additional fingers to ensure that functional gates do not fall near the edge of deposited poly, as this region may exhibit elevated incidences of manufacturing defects compared to other regions. The number of fins may dictate the channel width of the transistor. A transistor having certain parameters may be included many times on a die. Rather than entering each transistor individually, that transistor type may be entered with a multiplier indicating the number of copies desired.

In some semiconductor embodiments, resistive structures have a standardized cross-sectional area or width, and a particular resistance is achieved by adjusting the length of the resistive structure. Therefore, the length of the structure for a particular resistive element may be specified with the width and cross-sectional area being implicit.

A multiplier may also be specified to indicate a number of capacitors, similar to the multiplier for transistors. A particular capacitive element may be implemented by arranging multiple unit capacitive elements in series or parallel, with the multiplier specifying how many unit capacitive elements form the particular element.

Similar to multi-fingered transistors, diodes may be constructed as parallel structures, with a number of fingers representing a number of elemental diode elements in parallel. Bipolar Junction Transistors (BJTs) may be modeled as having a constant contribution to the parasitic parameters of a die design.

Net type structures are modeled as nodes at connection points between devices. Each net has a fanout N of at least two, representing the two (or more) structures connected at a net node. For example, a resistor terminal connected from a source device to a transistor gate and a capacitor terminal may be represented as a single net node with a fanout of three (including the source device terminal). Exemplary nets are elaborated upon in FIG. 4. "Nets" refers to connection networks between devices in a circuit schematic.

Figure 3:
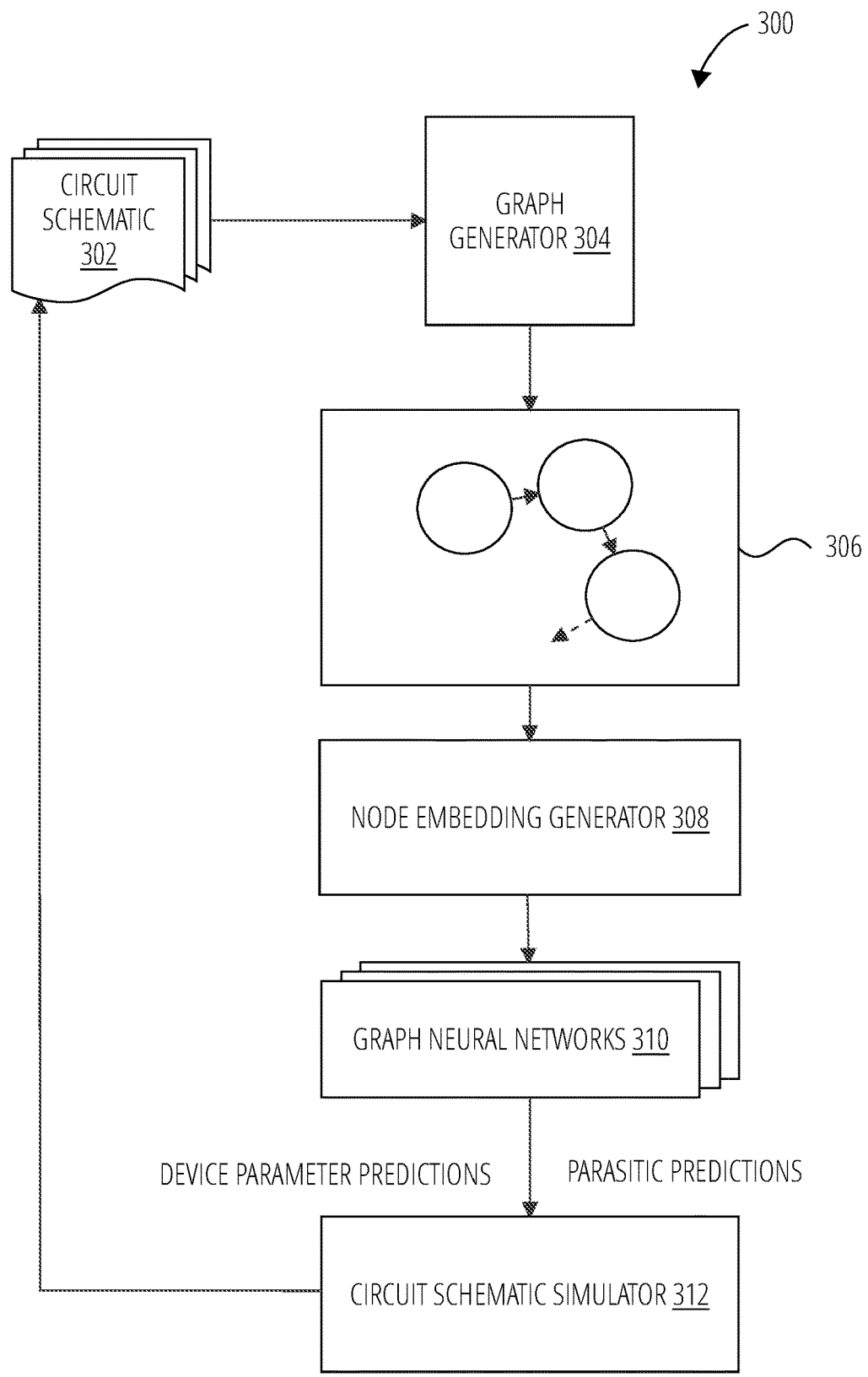
FIG. 3 illustrates a system 300 in accordance with one embodiment.

FIG. 3 depicts a system 300 according to one embodiment. The system 300 comprises a circuit schematic 302 input to a graph generator 304 that transforms the circuit schematic 302 a graph 306, which is in turn transformed by a node embedding generator 308 into node embeddings in graph neural networks 310. "Node embedding" refers to the transformation of graph nodes, graph edges, and their assigned features into vector space whilst preserving properties such as graph structure. The graph neural networks 310, which may implement an ensemble modeling algorithm as described below, generate device parameter predictions and parasitic predictions that are input to a circuit schematic simulator 312.

Results of the simulation by the circuit schematic simulator 312 may be fed back to provide automatic or manual optimizations to the circuit schematic 302.

Figure 4:
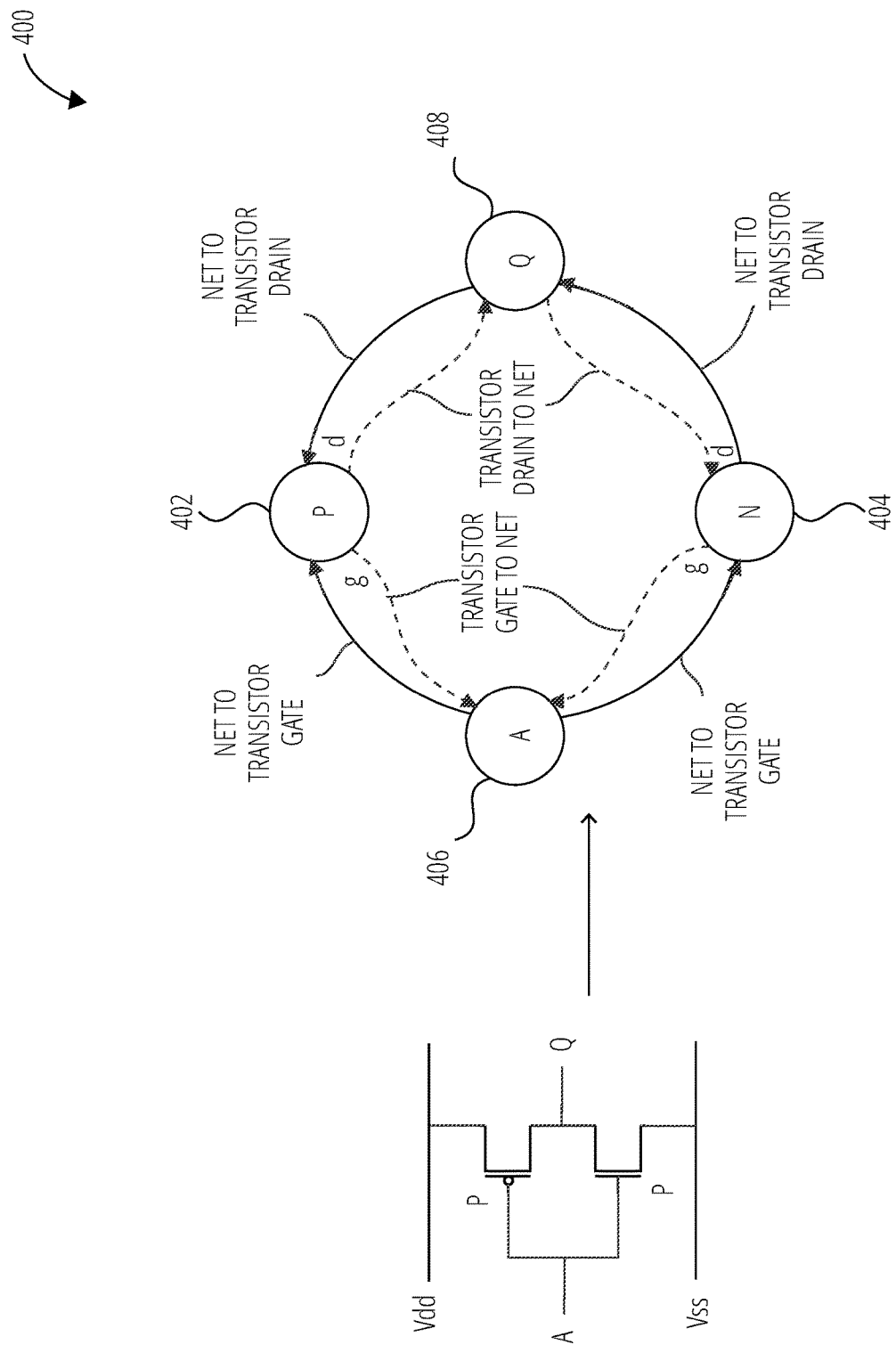
FIG. 4 depicts a heterogeneous graph 400 in accordance with one embodiment.

FIG. 4 depicts the heterogeneous graph 400 for an inverter circuit. The heterogeneous graph 400 comprises a transistor node 402, a transistor node 404, a net node 406, and a net node 408. Each device, i.e., transistor, resistor, capacitor, etc., is assigned to a node in the graph, and the nets between devices are mapped to edge nodes. Each output-pin-to-input-pin path is mapped with a direct edge between two nodes. With this graph mapping method, the net does not directly map to any particular element of the graph. To predict net parasitic capacitance, each net is mapped as a node in the graph with two edges between the net and its connected device nodes in the graph. The benefits of mapping both net and device into graph nodes is that the relationships between devices and nets become explicit in the graph and can be used in learning. It also naturally supports hyperedges between devices, because each net node can connect to multiple device nodes. Multiple edge relations between net nodes and device nodes are incorporated based on device terminal types.

For example, there are three terminals in a transistor device node: 'gate', 'source', and 'drain'. The edges between these three terminals and their connected net have different types. This assists the learning process to differentiate different connection structures. Connections to VDD (source power) and GND (ground) rails may be ignored in the graph because there are typically too many connections to those nets, and it is often unnecessary to predict parasitics on those nets. The resulting graph is a heterogeneous Graph G=(V, E), including a node set V and a directed edge set E.

The heterogeneous graph is also associated with a node type mapping function $\phi: V \rightarrow TN$, where TN is a set of node types, i.e., {transistor, net, capacitor, resistor, etc.}, and an edge type mapping function $\psi: E \rightarrow T_E$, where $T_E$ is a set of edge types, i.e., {net→transistor$_{gate}$, transistor$_{gate}$→net, net→transistor$_{source}$, etc.}. There are two edges with opposing directions between two nodes, and the edge types for the opposite directions are different. For example, the opposite edge of type net→transistor$_{gate}$ is an edge of type transistor$_{gate}$→net.

FIG. 5 depicts a graph neural network embedding algorithm 500 in one embodiment. The graph neural network embedding algorithm 500 comprises an aggregation algorithm for use with heterogeneous graphs that represent circuit schematics. In the graph neural network embedding algorithm 500, an embedding is generated by each network layer computation, and that embedding is concatenated with the aggregated neighbor embeddings. The different edge types are grouped independently during aggregation. A self-attention layer is inserted between the aggregation layers of each group. This attention layer may by implemented by Softmax or a similar function to calculate the vector distance between nodes and weight the embedding. "Attention layer" refers to techniques known in the art for recognizing correlations between neural network internal states. Rather than utilizing a simple concatenation or dot product, an attention operation produces vectors representing different encoder hidden states and assigns the vectors different weights. Attention layers and attention mechanisms have conventionally been applied for natural language processing by neural networks. Generally, attention mechanisms apply intermediate encoder states of the neural network, rather than just a final encoder state, to construct the context vectors utilized by the decoder logic of the neural network, to generate the output sequence.

A relatively low vector distance (as determined by a configured metric, for example) may indicate similarity between the nodes, indicating that elevated 'attention' may be assigned to an embedding source by assigning that source greater relative weight during generation of the resultant aggregate values.

Figure 6:
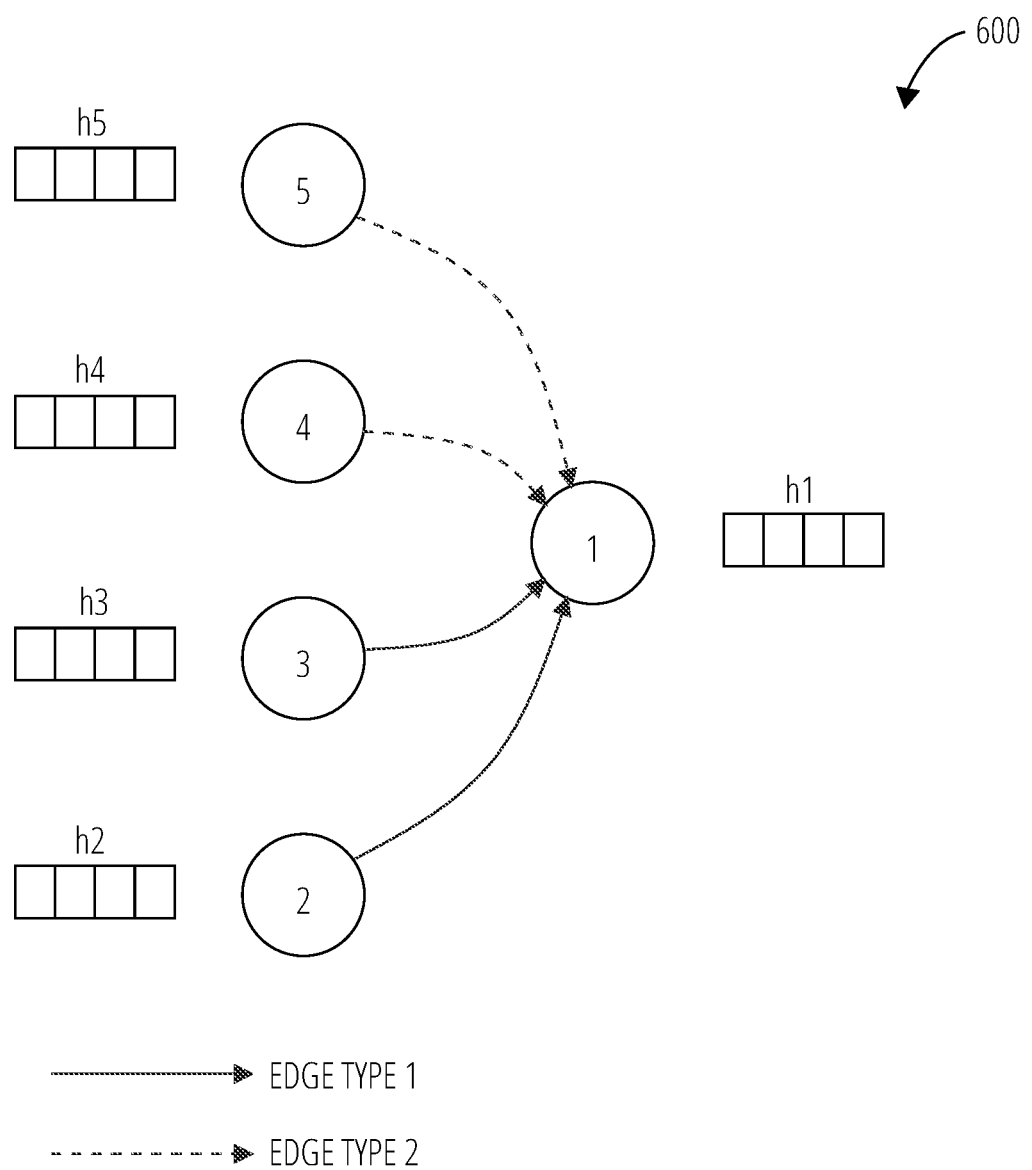
FIG. 6 depicts an exemplary graph node and edges 600 in accordance with one embodiment.
Figure 7:
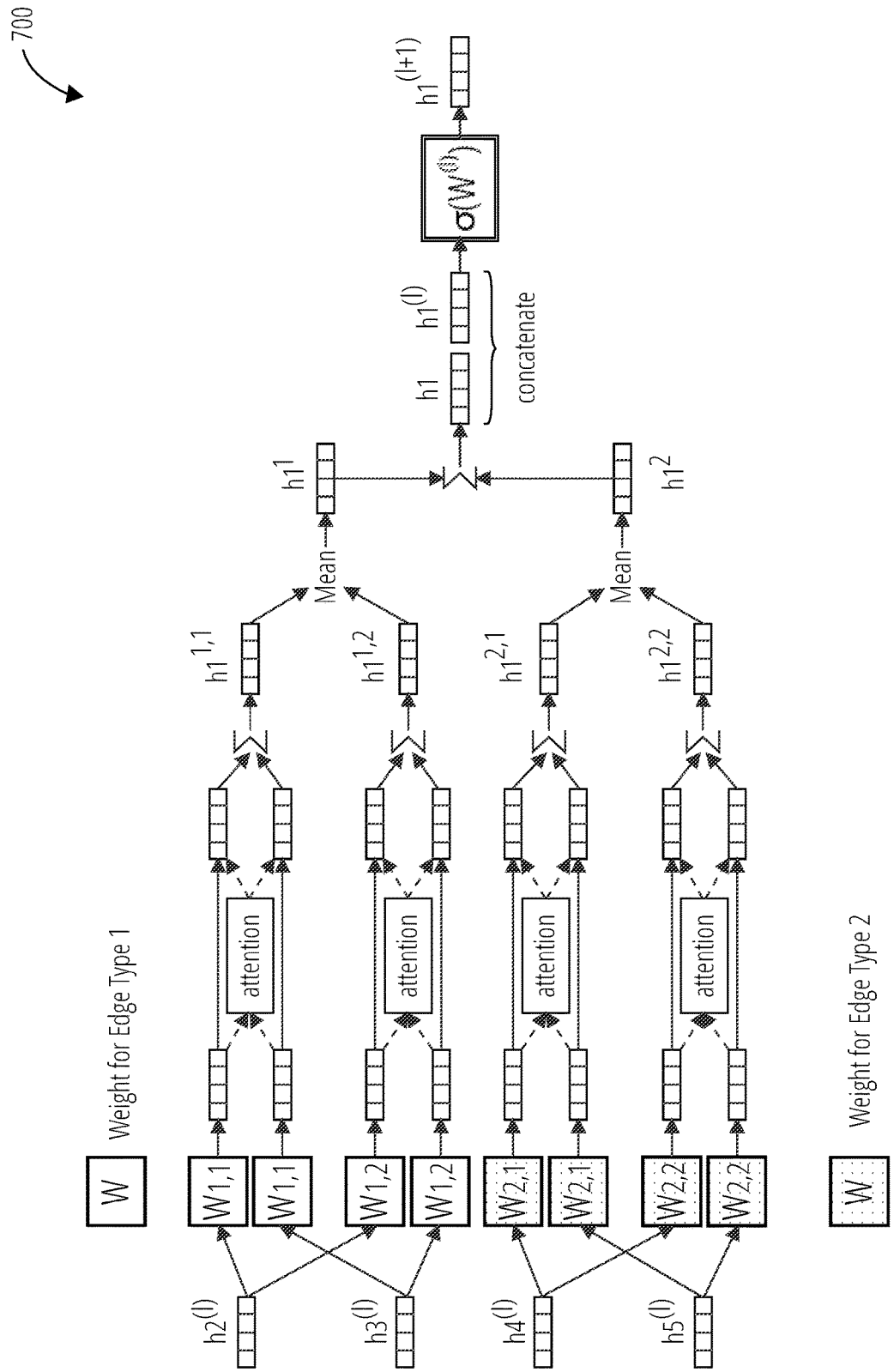
FIG. 7 depicts a compute graph 700 in accordance with one embodiment.

The graph neural network embedding algorithm 500 utilizes operations that are not readily recognized as combinable in a straightforward manner in conventional approaches. FIG. 6 depicts an exemplary graph node and edges 600. In FIG. 6, node 1 has four input edges with two different edge types. FIG. 7 depicts a compute graph 700 for the exemplary graph node and edges 600 between embedding layer l and embedding layer l+1. The compute graph 700 represents a graph convolutional layer with an attention head K=2.

The graph neural network embedding algorithm 500 computes the node embedding for each node of the graph. To predict a specific parasitic y on a node type t, the node embedding $Z_t$ of node type t is communicated to several fully connected (FC) layers. The FC layers (except the last one) have the dimensions of the embeddings, and the last layer has one dimension. A mean square error (MSE) loss function may then be utilized to regress the predicted value and the ground truth. A distinct model may be trained for each device parameter and layout parasitic.

Figure 8:
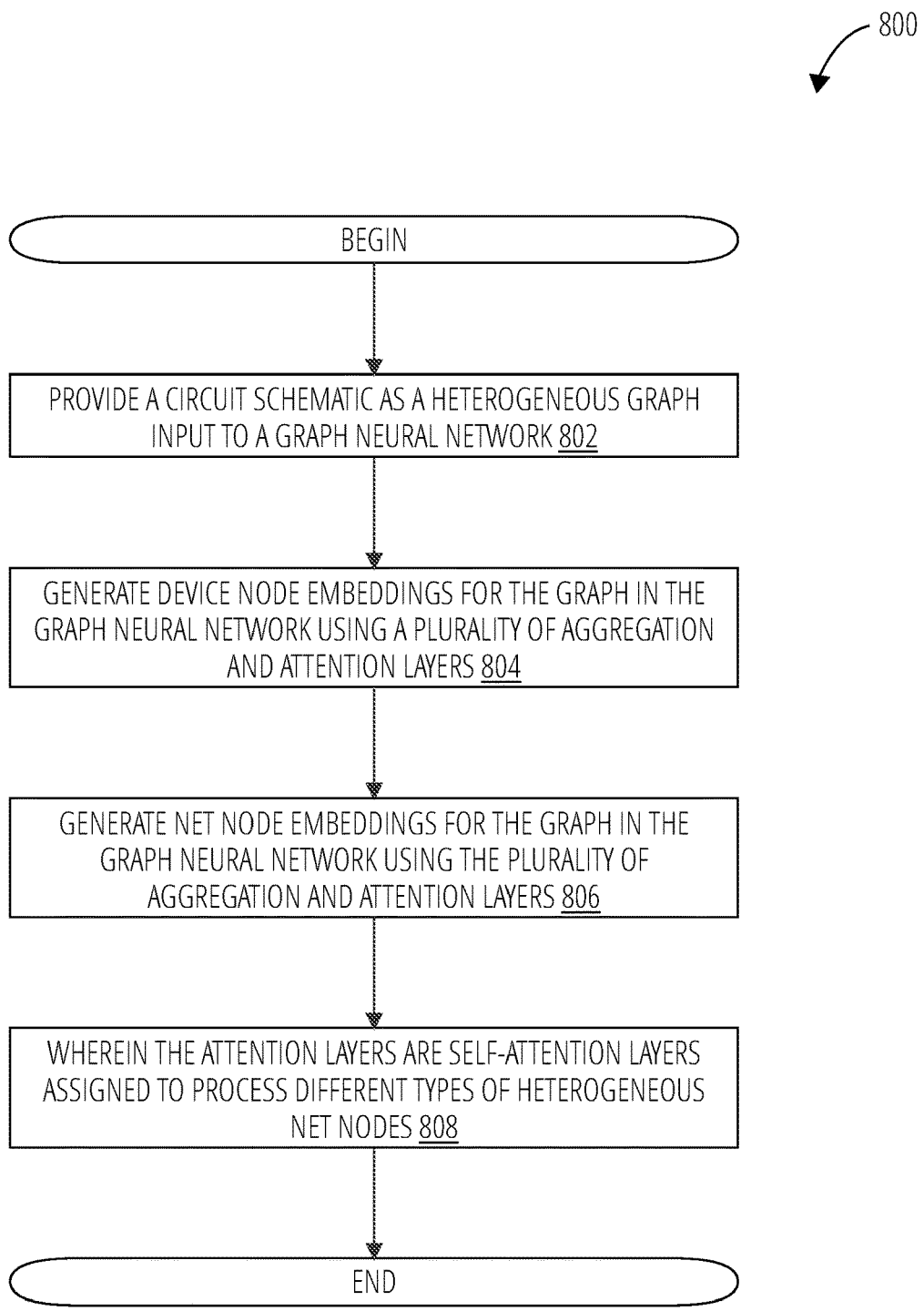
FIG. 8 illustrates a routine 800 in accordance with one embodiment.

FIG. 8 depicts a routine 800 in one embodiment. At block 802, a circuit schematic is provided as a heterogeneous graph input to a graph neural network. At block 804, device node embeddings are generated for the graph in the graph neural network using a plurality of aggregation and attention layers. At block 806, net node embeddings for the graph are generated in the graph neural network using the plurality of aggregation and attention layers, wherein (block 808) the attention layers are configured as self-attention layers assigned to process different types of heterogeneous net nodes.

Figure 9:
FIG. 9 depicts an ensemble modeling algorithm 900 in accordance with one embodiment.

FIG. 9 depicts an ensemble modeling algorithm 900 to select prediction values from an ensemble of prediction models, in one embodiment. In one implementations, the same model may be used throughout with each model trained using different data sets. In other implementations, different models each tuned to a provide a different range of predictions may be combined.

Figure 10:
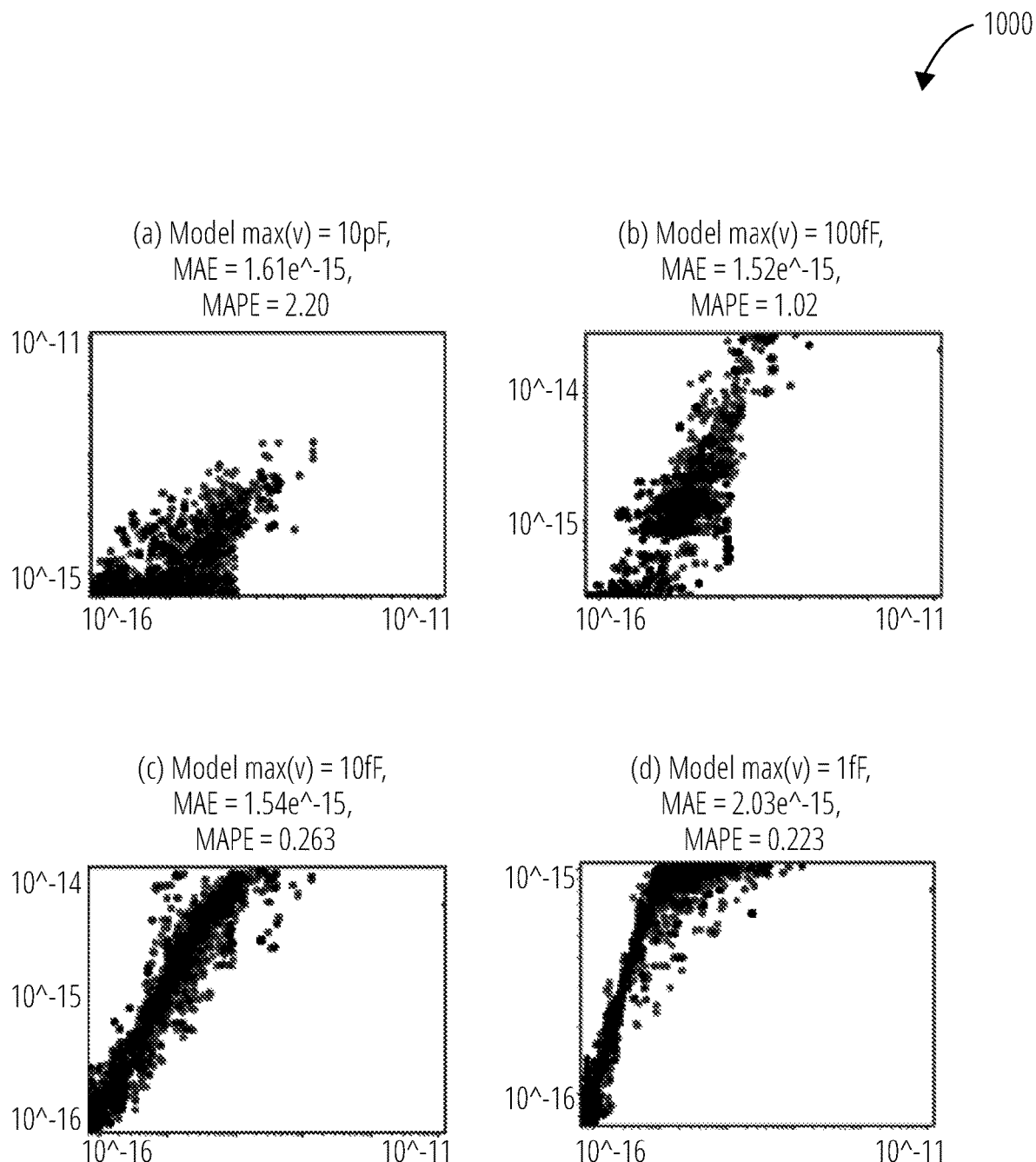
FIG. 10 depicts parasitic capacitance predictions 1000 in accordance with one embodiment.

Modern analog and mixed-signal designs may exhibit net parasitic capacitance in a range between 0.01 fF to 10 pF. This range is several orders of magnitude. Training a single model to predict the entire range would be challenging. The inherent model error due to layout uncertainty typically greatly exceeds 1%, which means any value less than 1% of the maximum predicted value may be treated as noise by the model, therefore the prediction accuracy on those small values may be poor. For example, the prediction may become unacceptably inaccurate when the ground truth parasitic value is smaller than 100 fF. To alleviate this problem, multiple models may be trained and utilized with common base prediction value levels but different maximum prediction value levels, thus configuring different prediction ranges. Data points with a ground truth exceeding maximum predicted values may be ignored during training. For example, three models may be trained to predict parasitic values less than 100 fF, less than 10 fF, and less than 1 fF, respectively. The predicted value and ground truth parasitic capacitance of a circuit inferenced with these three models are depicted by the parasitic capacitance predictions 1000 in FIG. 10. In FIG. 10 the x-axis is the original (ground truth) values and the y-axis is the predicted values.

Ensemble modeling may thus be utilized to improve the accuracy of predictions by selecting the prediction of one model for each net capacitance based on the range of its predicted value, assuming the model with a high value range would demonstrate improved accuracy for high values.

The algorithms and techniques disclosed herein (e.g., graph neural network embedding algorithm 500, compute graph 700, and/or ensemble modeling algorithm 900) may be executed by computing devices utilizing one or more graphic processing unit (GPU) and/or general purpose data processor (e.g., a central processing unit or CPU). Exemplary architectures will now be described that may be configured to carry out the techniques disclosed herein on such devices.

The following description may use certain acronyms and abbreviations as follows:
"DPC" refers to a "data processing cluster".
"GPC" refers to a "general processing cluster".
"I/O" refers to an "input/output".
"L1 cache" refers to "level one cache".
"L2 cache" refers to "level two cache".
"LSU" refers to a "load/store unit".
"MMU" refers to a "memory management unit".
"MPC" refers to an "M-pipe controller".
"PPU" refers to a "parallel processing unit".
"PROP" refers to a "pre-raster operations unit".
"ROP" refers to "raster operations".
"SFU" refers to a "special function unit".
"SM" refers to a "streaming multiprocessor".
"Viewport SCC" refers to "viewport scale, cull, and clip".
"WDX" refers to a "work distribution crossbar".
"XBar" refers to a "crossbar".

Parallel Processing Unit

Figure 11:
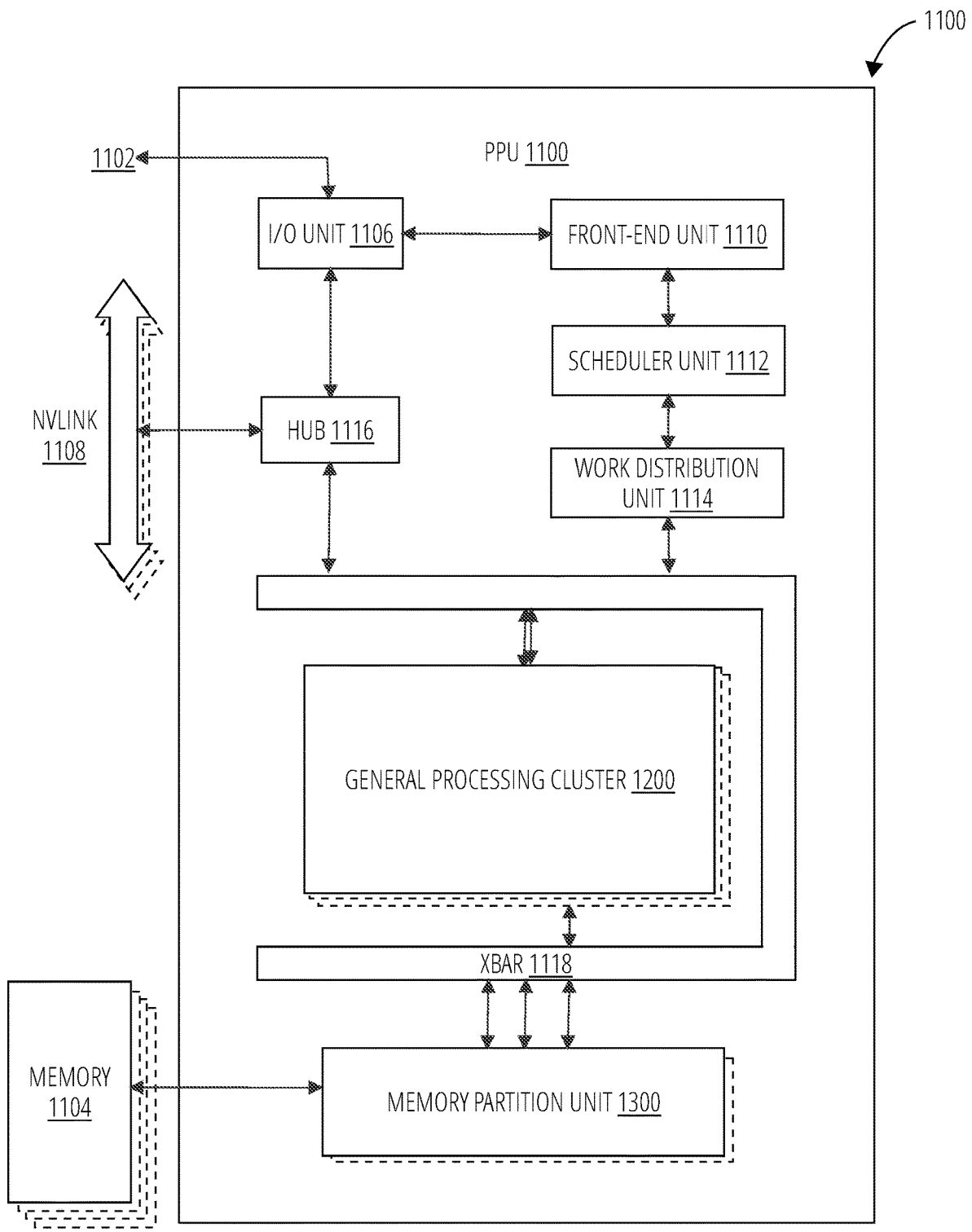
FIG. 11 depicts a parallel processing unit 1100 in accordance with one embodiment.

FIG. 11 depicts a parallel processing unit 1100, in accordance with an embodiment. In an embodiment, the parallel processing unit 1100 is a multi-threaded processor that is implemented on one or more integrated circuit devices. The parallel processing unit 1100 is a latency hiding architecture designed to process many threads in parallel. A thread (e.g., a thread of execution) is an instantiation of a set of instructions configured to be executed by the parallel processing unit 1100. In an embodiment, the parallel processing unit 1100 is a graphics processing unit (GPU) configured to implement a graphics rendering pipeline for processing three-dimensional (3D) graphics data in order to generate two-dimensional (2D) image data for display on a display device such as a liquid crystal display (LCD) device. In other embodiments, the parallel processing unit 1100 may be utilized for performing general-purpose computations such as the graph neural network embedding algorithm 500 and the ensemble modeling algorithm 900. While one exemplary parallel processor is provided herein for illustrative purposes, it should be strongly noted that such processor is set forth for illustrative purposes, and that any processor may be employed to supplement and/or substitute for the same.

One or more parallel processing unit 1100 modules may be configured to accelerate thousands of High Performance Computing (HPC), data center, and machine learning applications. The parallel processing unit 1100 may be configured to accelerate numerous deep learning systems (e.g., graph neural network training and inference) and applications including autonomous vehicle platforms, deep learning, high-accuracy speech, image, and text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, personalized user recommendations, and the like.

As shown in FIG. 11, the parallel processing unit 1100 includes an I/O unit 1106, a front-end unit 1110, a scheduler unit 1112, a work distribution unit 1114, a hub 1116, a crossbar 1118, one or more general processing cluster 1200 modules, and one or more memory partition unit 1300 modules. The parallel processing unit 1100 may be connected to a host processor or other parallel processing unit 1100 modules via one or more high-speed NVLink 1108 interconnects. The parallel processing unit 1100 may be connected to a host processor or other peripheral devices via an interconnect 1102. The parallel processing unit 1100 may also be connected to a local memory comprising a number of memory 1104 devices. In an embodiment, the local memory may comprise a number of dynamic random access memory (DRAM) devices. The DRAM devices may be configured as a high-bandwidth memory (HBM) subsystem, with multiple DRAM dies stacked within each device. The memory 1104 may comprise logic to configure the parallel processing unit 1100 to carry out aspects of the techniques disclosed herein.

The NVLink 1108 interconnect enables systems to scale and include one or more parallel processing unit 1100 modules combined with one or more CPUs, supports cache coherence between the parallel processing unit 1100 modules and CPUs, and supports CPU mastering. Data and/or commands may be transmitted by the NVLink 1108 through the hub 1116 to/from other units of the parallel processing unit 1100, such as one or more copy engines, a video encoder, a video decoder, a power management unit, etc. (not explicitly shown). The NVLink 1108 is described in more detail in conjunction with FIG. 15.

The I/O unit 1106 is configured to transmit and receive communications (e.g., commands, data, etc.) from a host processor (not shown) over the interconnect 1102. The I/O unit 1106 may communicate with the host processor directly via the interconnect 1102 or through one or more intermediate devices, such as a memory bridge. In an embodiment, the I/O unit 1106 may communicate with one or more other processors, such as one or more parallel processing unit 1100 modules, via the interconnect 1102. In an embodiment, the I/O unit 1106 implements a Peripheral Component Interconnect Express (PCIe) interface for communications over a PCIe bus, and the interconnect 1102 is a PCIe bus. In alternative embodiments, the I/O unit 1106 may implement other types of well-known interfaces for communicating with external devices.

The I/O unit 1106 decodes packets received via the interconnect 1102. In an embodiment, the packets represent commands configured to cause the parallel processing unit 1100 to perform various operations. The I/O unit 1106 transmits the decoded commands to various other units of the parallel processing unit 1100 as the commands may specify. For example, some commands may be transmitted to the front-end unit 1110. Other commands may be transmitted to the hub 1116 or other units of the parallel processing unit 1100, such as one or more copy engines, a video encoder, a video decoder, a power management unit, etc. (not explicitly shown). In other words, the I/O unit 1106 is configured to route communications between and among the various logical units of the parallel processing unit 1100.

In an embodiment, a program executed by the host processor encodes a command stream in a buffer that provides workloads to the parallel processing unit 1100 for processing. A workload may comprise several instructions and data to be processed by those instructions. The buffer is a region in a memory that is accessible (e.g., readable/writeable) by both the host processor and the parallel processing unit 1100. For example, the I/O unit 1106 may be configured to access the buffer in a system memory connected to the interconnect 1102 via memory requests transmitted over the interconnect 1102. In an embodiment, the host processor writes the command stream to the buffer and then transmits a pointer to the start of the command stream to the parallel processing unit 1100. The front-end unit 1110 receives pointers to one or more command streams. The front-end unit 1110 manages the one or more streams, reading commands from the streams and forwarding commands to the various units of the parallel processing unit 1100.

The front-end unit 1110 is coupled to a scheduler unit 1112 that configures the various general processing cluster 1200 modules to process tasks defined by the one or more streams. The scheduler unit 1112 is configured to track state information related to the various tasks managed by the scheduler unit 1112. The state may indicate which general processing cluster 1200 a task is assigned to, whether the task is active or inactive, a priority level associated with the task, and so forth. The scheduler unit 1112 manages the execution of a plurality of tasks on the one or more general processing cluster 1200 modules.

The scheduler unit 1112 is coupled to a work distribution unit 1114 that is configured to dispatch tasks for execution on the general processing cluster 1200 modules. The work distribution unit 1114 may track a number of scheduled tasks received from the scheduler unit 1112. In an embodiment, the work distribution unit 1114 manages a pending task pool and an active task pool for each of the general processing cluster 1200 modules. The pending task pool may comprise a number of slots (e.g., 32 slots) that contain tasks assigned to be processed by a particular general processing cluster 1200. The active task pool may comprise a number of slots (e.g., 4 slots) for tasks that are actively being processed by the general processing cluster 1200 modules. As a general processing cluster 1200 finishes the execution of a task, that task is evicted from the active task pool for the general processing cluster 1200 and one of the other tasks from the pending task pool is selected and scheduled for execution on the general processing cluster 1200. If an active task has been idle on the general processing cluster 1200, such as while waiting for a data dependency to be resolved, then the active task may be evicted from the general processing cluster 1200 and returned to the pending task pool while another task in the pending task pool is selected and scheduled for execution on the general processing cluster 1200.

The work distribution unit 1114 communicates with the one or more general processing cluster 1200 modules via crossbar 1118. The crossbar 1118 is an interconnect network that couples many of the units of the parallel processing unit 1100 to other units of the parallel processing unit 1100. For example, the crossbar 1118 may be configured to couple the work distribution unit 1114 to a particular general processing cluster 1200. Although not shown explicitly, one or more other units of the parallel processing unit 1100 may also be connected to the crossbar 1118 via the hub 1116.

The tasks are managed by the scheduler unit 1112 and dispatched to a general processing cluster 1200 by the work distribution unit 1114. The general processing cluster 1200 is configured to process the task and generate results. The results may be consumed by other tasks within the general processing cluster 1200, routed to a different general processing cluster 1200 via the crossbar 1118, or stored in the memory 1104. The results can be written to the memory 1104 via the memory partition unit 1300 modules, which implement a memory interface for reading and writing data to/from the memory 1104. The results can be transmitted to another parallel processing unit 1100 or CPU via the NVLink 1108. In an embodiment, the parallel processing unit 1100 includes a number U of memory partition unit 1300 modules that is equal to the number of separate and distinct memory 1104 devices coupled to the parallel processing unit 1100. A memory partition unit 1300 will be described in more detail below in conjunction with FIG. 13.

In an embodiment, a host processor executes a driver kernel that implements an application programming interface (API) that enables one or more applications executing on the host processor to schedule operations for execution on the parallel processing unit 1100. In an embodiment, multiple compute applications are simultaneously executed by the parallel processing unit 1100 and the parallel processing unit 1100 provides isolation, quality of service (QoS), and independent address spaces for the multiple compute applications. An application may generate instructions (e.g., API calls) that cause the driver kernel to generate one or more tasks for execution by the parallel processing unit 1100. The driver kernel outputs tasks to one or more streams being processed by the parallel processing unit 1100. Each task may comprise one or more groups of related threads, referred to herein as a warp. In an embodiment, a warp comprises thirty-two related threads that may be executed in parallel. Cooperating threads may refer to a plurality of threads including instructions to perform the task and that may exchange data through shared memory. Threads and cooperating threads are described in more detail in conjunction with FIG. 14.

Figure 12:
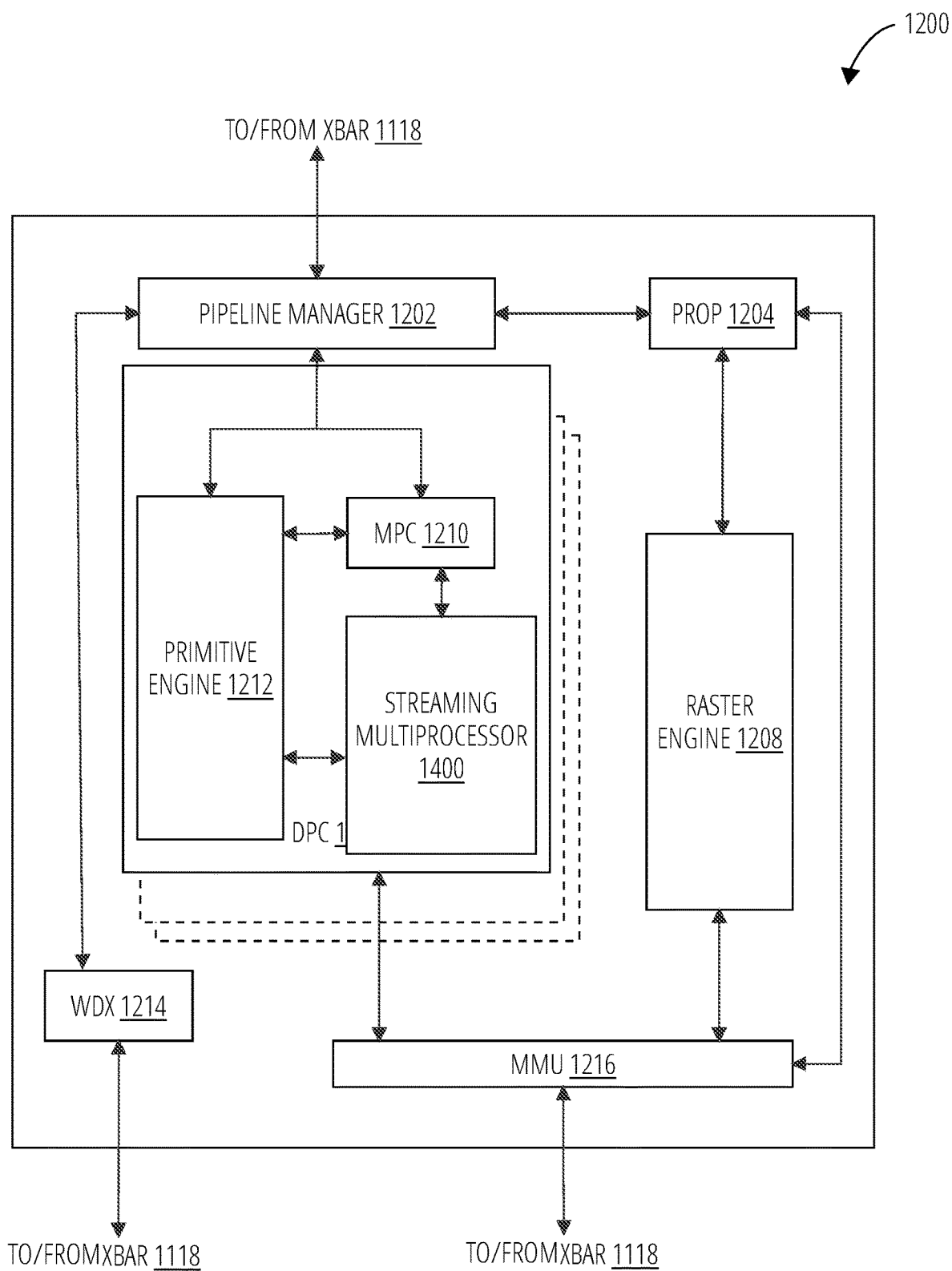
FIG. 12 depicts a general processing cluster 1200 in accordance with one embodiment.

FIG. 12 depicts a general processing cluster 1200 of the parallel processing unit 1100 of FIG. 11, in accordance with an embodiment. As shown in FIG. 12, each general processing cluster 1200 includes a number of hardware units for processing tasks. In an embodiment, each general processing cluster 1200 includes a pipeline manager 1202, a pre-raster operations unit 1204, a raster engine 1208, a work distribution crossbar 1214, a memory management unit 1216, and one or more data processing cluster 1206. It will be appreciated that the general processing cluster 1200 of FIG. 12 may include other hardware units in lieu of or in addition to the units shown in FIG. 12.

In an embodiment, the operation of the general processing cluster 1200 is controlled by the pipeline manager 1202. The pipeline manager 1202 manages the configuration of the one or more data processing cluster 1206 modules for processing tasks allocated to the general processing cluster 1200. In an embodiment, the pipeline manager 1202 may configure at least one of the one or more data processing cluster 1206 modules to implement at least a portion of a graphics rendering pipeline. For example, a data processing cluster 1206 may be configured to execute a vertex shader program on the programmable streaming multiprocessor 1400. The pipeline manager 1202 may also be configured to route packets received from the work distribution unit 1114 to the appropriate logical units within the general processing cluster 1200. For example, some packets may be routed to fixed function hardware units in the pre-raster operations unit 1204 and/or raster engine 1208 while other packets may be routed to the data processing cluster 1206 modules for processing by the primitive engine 1212 or the streaming multiprocessor 1400. In an embodiment, the pipeline manager 1202 may configure at least one of the one or more data processing cluster 1206 modules to implement a neural network model and/or a computing pipeline.

Figure 13:
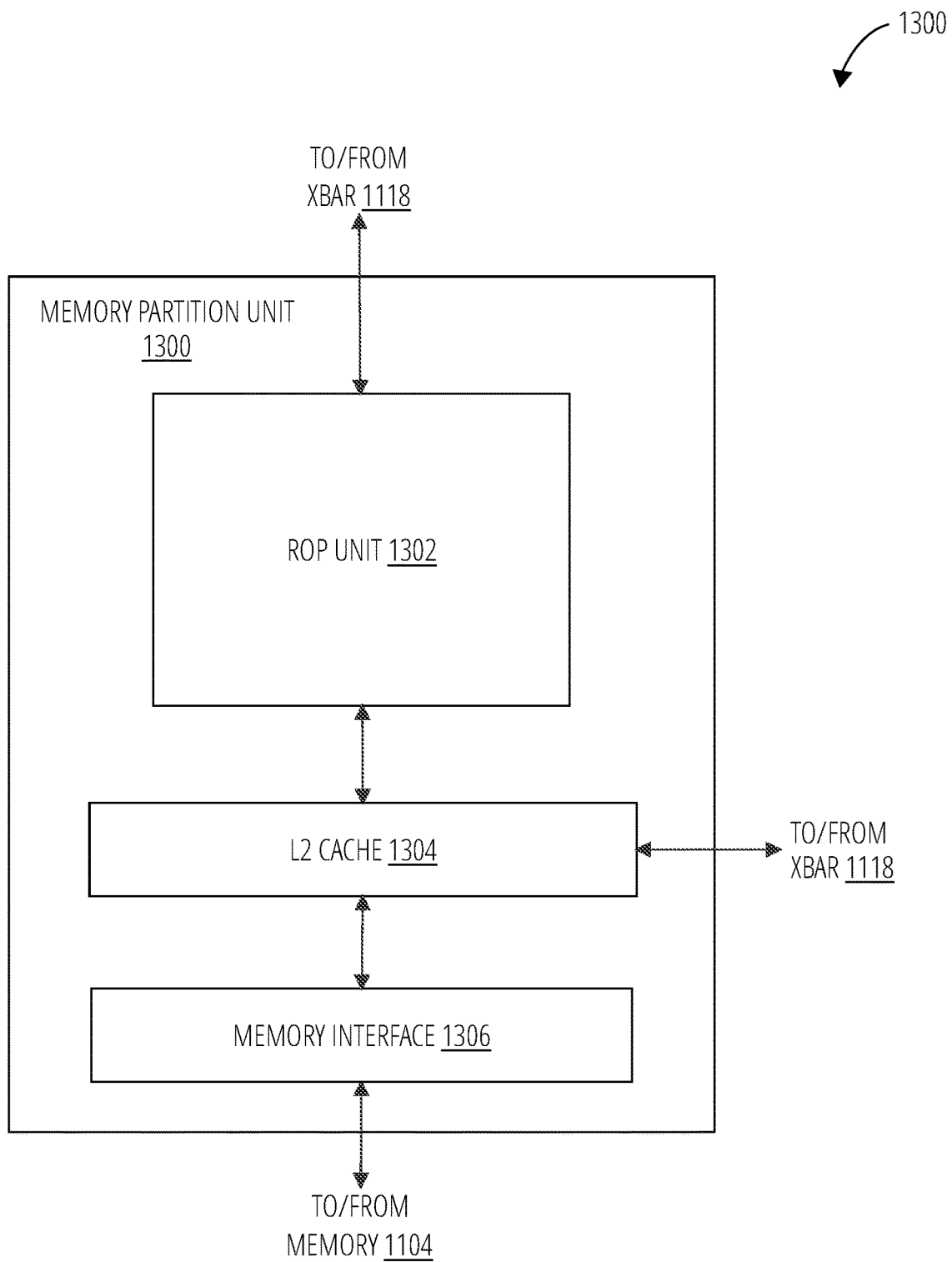
FIG. 13 depicts a memory partition unit 1300 in accordance with one embodiment.

The pre-raster operations unit 1204 is configured to route data generated by the raster engine 1208 and the data processing cluster 1206 modules to a Raster Operations (ROP) unit, described in more detail in conjunction with FIG. 13. The pre-raster operations unit 1204 may also be configured to perform optimizations for color blending, organize pixel data, perform address translations, and the like.

The raster engine 1208 includes a number of fixed function hardware units configured to perform various raster operations. In an embodiment, the raster engine 1208 includes a setup engine, a coarse raster engine, a culling engine, a clipping engine, a fine raster engine, and a tile coalescing engine. The setup engine receives transformed vertices and generates plane equations associated with the geometric primitive defined by the vertices. The plane equations are transmitted to the coarse raster engine to generate coverage information (e.g., an x, y coverage mask for a tile) for the primitive. The output of the coarse raster engine is transmitted to the culling engine where fragments associated with the primitive that fail a z-test are culled and transmitted to a clipping engine where fragments lying outside a viewing frustum are clipped. Those fragments that survive clipping and culling may be passed to the fine raster engine to generate attributes for the pixel fragments based on the plane equations generated by the setup engine. The output of the raster engine 1208 comprises fragments to be processed, for example, by a fragment shader implemented within a data processing cluster 1206.

Each data processing cluster 1206 included in the general processing cluster 1200 includes an M-pipe controller 1210, a primitive engine 1212, and one or more streaming multiprocessor 1400 modules. The M-pipe controller 1210 controls the operation of the data processing cluster 1206, routing packets received from the pipeline manager 1202 to the appropriate units in the data processing cluster 1206. For example, packets associated with a vertex may be routed to the primitive engine 1212, which is configured to fetch vertex attributes associated with the vertex from the memory 1104. In contrast, packets associated with a shader program may be transmitted to the streaming multiprocessor 1400.

The streaming multiprocessor 1400 comprises a programmable streaming processor that is configured to process tasks represented by a number of threads. Each streaming multiprocessor 1400 is multi-threaded and configured to execute a plurality of threads (e.g., 32 threads) from a particular group of threads concurrently. In an embodiment, the streaming multiprocessor 1400 implements a Single-Instruction, Multiple-Data (SIMD) architecture where each thread in a group of threads (e.g., a warp) is configured to process a different set of data based on the same set of instructions. All threads in the group of threads execute the same instructions. In another embodiment, the streaming multiprocessor 1400 implements a Single-Instruction, Multiple Thread (SIMT) architecture where each thread in a group of threads is configured to process a different set of data based on the same set of instructions, but where individual threads in the group of threads are allowed to diverge during execution. In an embodiment, a program counter, call stack, and execution state are maintained for each warp, enabling concurrency between warps and serial execution within warps when threads within the warp diverge. In another embodiment, a program counter, call stack, and execution state are maintained for each individual thread, enabling equal concurrency between all threads, within and between warps. When execution state is maintained for each individual thread, threads executing the same instructions may be converged and executed in parallel for maximum efficiency. The streaming multiprocessor 1400 will be described in more detail below in conjunction with FIG. 14.

The memory management unit 1216 provides an interface between the general processing cluster 1200 and the memory partition unit 1300. The memory management unit 1216 may provide translation of virtual addresses into physical addresses, memory protection, and arbitration of memory requests. In an embodiment, the memory management unit 1216 provides one or more translation lookaside buffers (TLBs) for performing translation of virtual addresses into physical addresses in the memory 1104.

FIG. 13 depicts a memory partition unit 1300 of the parallel processing unit 1100 of FIG. 11, in accordance with an embodiment. As shown in FIG. 13, the memory partition unit 1300 includes a raster operations unit 1302, a level two cache 1304, and a memory interface 1306. The memory interface 1306 is coupled to the memory 1104. Memory interface 1306 may implement 32, 64, 128, 1024-bit data buses, or the like, for high-speed data transfer. In an embodiment, the parallel processing unit 1100 incorporates U memory interface 1306 modules, one memory interface 1306 per pair of memory partition unit 1300 modules, where each pair of memory partition unit 1300 modules is connected to a corresponding memory 1104 device. For example, parallel processing unit 1100 may be connected to up to Y memory 1104 devices, such as high bandwidth memory stacks or graphics double-data-rate, version 5, synchronous dynamic random access memory, or other types of persistent storage.

In an embodiment, the memory interface 1306 implements an HBM2 memory interface and Y equals half U. In an embodiment, the HBM2 memory stacks are located on the same physical package as the parallel processing unit 1100, providing substantial power and area savings compared with conventional GDDR5 SDRAM systems. In an embodiment, each HBM2 stack includes four memory dies and Y equals 4, with HBM2 stack including two 128-bit channels per die for a total of 8 channels and a data bus width of 1024 bits.

In an embodiment, the memory 1104 supports Single-Error Correcting Double-Error Detecting (SECDED) Error Correction Code (ECC) to protect data. ECC provides higher reliability for compute applications that are sensitive to data corruption. Reliability is especially important in large-scale cluster computing environments where parallel processing unit 1100 modules process very large datasets and/or run applications for extended periods.

In an embodiment, the parallel processing unit 1100 implements a multi-level memory hierarchy. In an embodiment, the memory partition unit 1300 supports a unified memory to provide a single unified virtual address space for CPU and parallel processing unit 1100 memory, enabling data sharing between virtual memory systems. In an embodiment the frequency of accesses by a parallel processing unit 1100 to memory located on other processors is traced to ensure that memory pages are moved to the physical memory of the parallel processing unit 1100 that is accessing the pages more frequently. In an embodiment, the NVLink 1108 supports address translation services allowing the parallel processing unit 1100 to directly access a CPU's page tables and providing full access to CPU memory by the parallel processing unit 1100.

In an embodiment, copy engines transfer data between multiple parallel processing unit 1100 modules or between parallel processing unit 1100 modules and CPUs. The copy engines can generate page faults for addresses that are not mapped into the page tables. The memory partition unit 1300 can then service the page faults, mapping the addresses into the page table, after which the copy engine can perform the transfer. In a conventional system, memory is pinned (e.g., non-pageable) for multiple copy engine operations between multiple processors, reducing the available memory. With hardware page faulting, addresses can be passed to the copy engines without worrying if the memory pages are resident, and the copy process is transparent.

Data from the memory 1104 or other system memory may be fetched by the memory partition unit 1300 and stored in the level two cache 1304, which is located on-chip and is shared between the various general processing cluster 1200 modules. As shown, each memory partition unit 1300 includes a portion of the level two cache 1304 associated with a corresponding memory 1104 device. Lower level caches may then be implemented in various units within the general processing cluster 1200 modules. For example, each of the streaming multiprocessor 1400 modules may implement an L1 cache. The L1 cache is private memory that is dedicated to a particular streaming multiprocessor 1400. Data from the level two cache 1304 may be fetched and stored in each of the L1 caches for processing in the functional units of the streaming multiprocessor 1400 modules. The level two cache 1304 is coupled to the memory interface 1306 and the crossbar 1118.

The raster operations unit 1302 performs graphics raster operations related to pixel color, such as color compression, pixel blending, and the like. The raster operations unit 1302 also implements depth testing in conjunction with the raster engine 1208, receiving a depth for a sample location associated with a pixel fragment from the culling engine of the raster engine 1208. The depth is tested against a corresponding depth in a depth buffer for a sample location associated with the fragment. If the fragment passes the depth test for the sample location, then the raster operations unit 1302 updates the depth buffer and transmits a result of the depth test to the raster engine 1208. It will be appreciated that the number of partition memory partition unit 1300 modules may be different than the number of general processing cluster 1200 modules and, therefore, each raster operations unit 1302 may be coupled to each of the general processing cluster 1200 modules. The raster operations unit 1302 tracks packets received from the different general processing cluster 1200 modules and determines which general processing cluster 1200 that a result generated by the raster operations unit 1302 is routed to through the crossbar 1118. Although the raster operations unit 1302 is included within the memory partition unit 1300 in FIG. 13, in other embodiment, the raster operations unit 1302 may be outside of the memory partition unit 1300. For example, the raster operations unit 1302 may reside in the general processing cluster 1200 or another unit.

Figure 14:
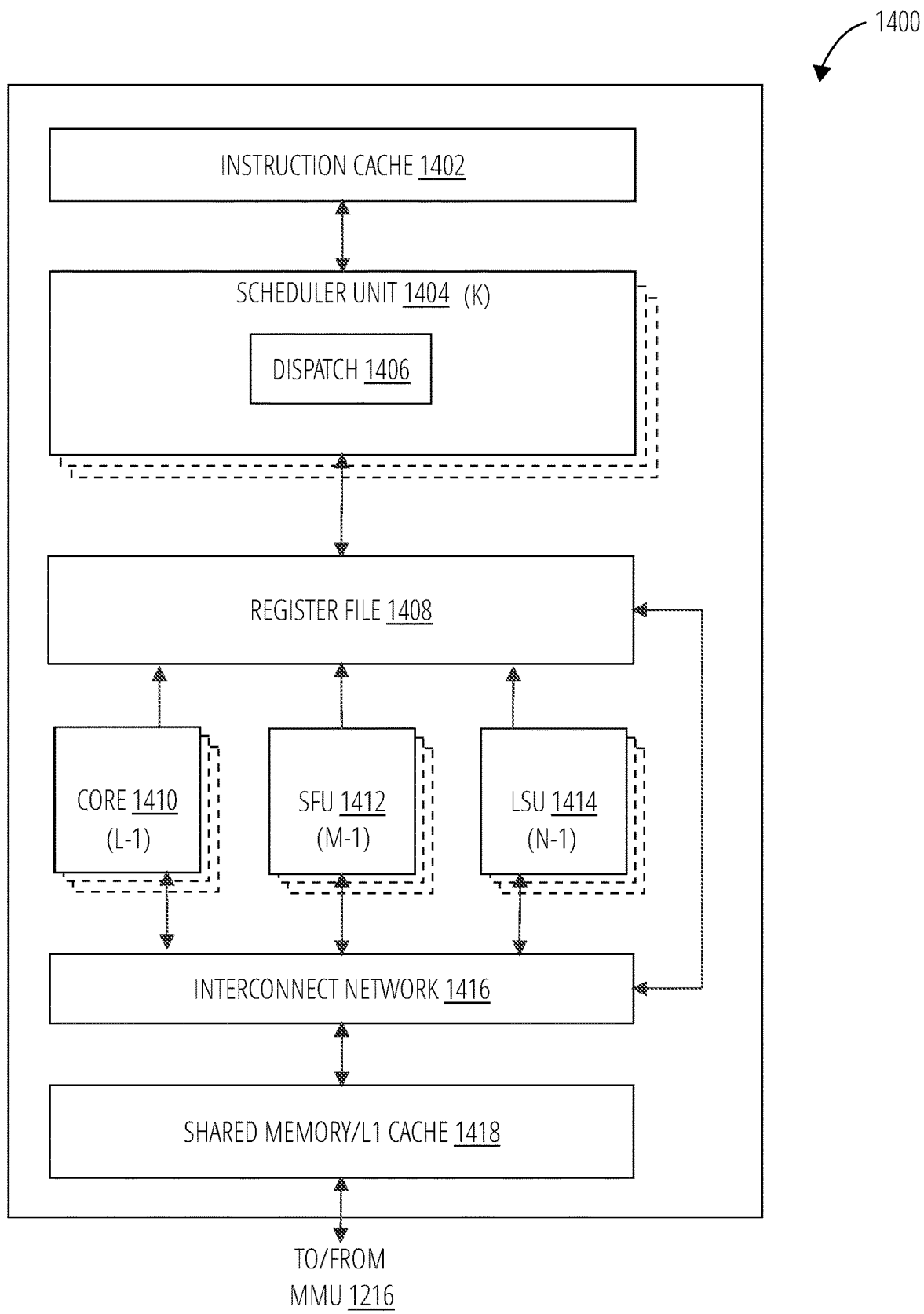
FIG. 14 depicts a streaming multiprocessor 1400 in accordance with one embodiment.

FIG. 14 illustrates the streaming multiprocessor 1400 of FIG. 12, in accordance with an embodiment. As shown in FIG. 14, the streaming multiprocessor 1400 includes an instruction cache 1402, one or more scheduler unit 1404 modules (e.g., such as scheduler unit 1112), a register file 1408, one or more processing core 1410 modules, one or more special function unit 1412 modules, one or more load/store unit 1414 modules, an interconnect network 1416, and a shared memory/L1 cache 1418.

As described above, the work distribution unit 1114 dispatches tasks for execution on the general processing cluster 1200 modules of the parallel processing unit 1100. The tasks are allocated to a particular data processing cluster 1206 within a general processing cluster 1200 and, if the task is associated with a shader program, the task may be allocated to a streaming multiprocessor 1400. The scheduler unit 1112 receives the tasks from the work distribution unit 1114 and manages instruction scheduling for one or more thread blocks assigned to the streaming multiprocessor 1400. The scheduler unit 1404 schedules thread blocks for execution as warps of parallel threads, where each thread block is allocated at least one warp. In an embodiment, each warp executes thirty-two threads. The scheduler unit 1404 may manage a plurality of different thread blocks, allocating the warps to the different thread blocks and then dispatching instructions from the plurality of different cooperative groups to the various functional units (e.g., core 1410 modules, special function unit 1412 modules, and load/store unit 1414 modules) during each clock cycle.

Cooperative Groups is a programming model for organizing groups of communicating threads that allows developers to express the granularity at which threads are communicating, enabling the expression of richer, more efficient parallel decompositions. Cooperative launch APIs support synchronization amongst thread blocks for the execution of parallel algorithms. Conventional programming models provide a single, simple construct for synchronizing cooperating threads: a barrier across all threads of a thread block (e.g., the syncthreads( ) function). However, programmers would often like to define groups of threads at smaller than thread block granularities and synchronize within the defined groups to enable greater performance, design flexibility, and software reuse in the form of collective group-wide function interfaces.

Cooperative Groups enables programmers to define groups of threads explicitly at sub-block (e.g., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

A dispatch 1406 unit is configured within the scheduler unit 1404 to transmit instructions to one or more of the functional units. In one embodiment, the scheduler unit 1404 includes two dispatch 1406 units that enable two different instructions from the same warp to be dispatched during each clock cycle. In alternative embodiments, each scheduler unit 1404 may include a single dispatch 1406 unit or additional dispatch 1406 units.

Each streaming multiprocessor 1400 includes a register file 1408 that provides a set of registers for the functional units of the streaming multiprocessor 1400. In an embodiment, the register file 1408 is divided between each of the functional units such that each functional unit is allocated a dedicated portion of the register file 1408. In another embodiment, the register file 1408 is divided between the different warps being executed by the streaming multiprocessor 1400. The register file 1408 provides temporary storage for operands connected to the data paths of the functional units.

Each streaming multiprocessor 1400 comprises L processing core 1410 modules. In an embodiment, the streaming multiprocessor 1400 includes a large number (e.g., 128, etc.) of distinct processing core 1410 modules. Each core 1410 may include a fully-pipelined, single-precision, double-precision, and/or mixed precision processing unit that includes a floating point arithmetic logic unit and an integer arithmetic logic unit. In an embodiment, the floating point arithmetic logic units implement the IEEE 754-2008 standard for floating point arithmetic. In an embodiment, the core 1410 modules include 64 single-precision (32-bit) floating point cores, 64 integer cores, 32 double-precision (64-bit) floating point cores, and 8 tensor cores.

Tensor cores configured to perform matrix operations, and, in an embodiment, one or more tensor cores are included in the core 1410 modules. In particular, the tensor cores are configured to perform deep learning matrix arithmetic, such as convolution operations for neural network training and inferencing. In an embodiment, each tensor core operates on a 4×4 matrix and performs a matrix multiply and accumulate operation D=A'B+C, where A, B, C, and D are 4×4 matrices.

In an embodiment, the matrix multiply inputs A and B are 16-bit floating point matrices, while the accumulation matrices C and D may be 16-bit floating point or 32-bit floating point matrices. Tensor Cores operate on 16-bit floating point input data with 32-bit floating point accumulation. The 16-bit floating point multiply is performed over 64 operations and results in a full precision product that is then accumulated using 32-bit floating point addition with the other intermediate products for a 4×4×4 matrix multiply. In practice, Tensor Cores are used to perform much larger two-dimensional or higher dimensional matrix operations, built up from these smaller elements. An API, such as CUDA 9 C++ API, exposes specialized matrix load, matrix multiply and accumulate, and matrix store operations to efficiently use Tensor Cores from a CUDA-C++ program. At the CUDA level, the warp-level interface assumes 16×16 size matrices spanning all 32 threads of the warp.

Each streaming multiprocessor 1400 also comprises M special function unit 1412 modules that perform special functions (e.g., attribute evaluation, reciprocal square root, and the like). In an embodiment, the special function unit 1412 modules may include a tree traversal unit configured to traverse a hierarchical tree data structure. In an embodiment, the special function unit 1412 modules may include texture unit configured to perform texture map filtering operations. In an embodiment, the texture units are configured to load texture maps (e.g., a 2D array of texels) from the memory 1104 and sample the texture maps to produce sampled texture values for use in shader programs executed by the streaming multiprocessor 1400. In an embodiment, the texture maps are stored in the shared memory/L1 cache 1418. The texture units implement texture operations such as filtering operations using mip-maps (e.g., texture maps of varying levels of detail). In an embodiment, each streaming multiprocessor 1400 includes two texture units.

Each streaming multiprocessor 1400 also comprises N load/store unit 1414 modules that implement load and store operations between the shared memory/L1 cache 1418 and the register file 1408. Each streaming multiprocessor 1400 includes an interconnect network 1416 that connects each of the functional units to the register file 1408 and the load/store unit 1414 to the register file 1408 and shared memory/L1 cache 1418. In an embodiment, the interconnect network 1416 is a crossbar that can be configured to connect any of the functional units to any of the registers in the register file

1408 and connect the load/store unit 1414 modules to the register file 1408 and memory locations in shared memory/L1 cache 1418.

The shared memory/L1 cache 1418 is an array of on-chip memory that allows for data storage and communication between the streaming multiprocessor 1400 and the primitive engine 1212 and between threads in the streaming multiprocessor 1400. In an embodiment, the shared memory/L1 cache 1418 comprises 128 KB of storage capacity and is in the path from the streaming multiprocessor 1400 to the memory partition unit 1300. The shared memory/L1 cache 1418 can be used to cache reads and writes. One or more of the shared memory/L1 cache 1418, level two cache 1304, and memory 1104 are backing stores.

Combining data cache and shared memory functionality into a single memory block provides the best overall performance for both types of memory accesses. The capacity is usable as a cache by programs that do not use shared memory. For example, if shared memory is configured to use half of the capacity, texture and load/store operations can use the remaining capacity. Integration within the shared memory/L1 cache 1418 enables the shared memory/L1 cache 1418 to function as a high-throughput conduit for streaming data while simultaneously providing high-bandwidth and low-latency access to frequently reused data.

When configured for general purpose parallel computation, a simpler configuration can be used compared with graphics processing. Specifically, the fixed function graphics processing units shown in FIG. 11, are bypassed, creating a much simpler programming model. In the general purpose parallel computation configuration, the work distribution unit 1114 assigns and distributes blocks of threads directly to the data processing cluster 1206 modules. The threads in a block execute the same program, using a unique thread ID in the calculation to ensure each thread generates unique results, using the streaming multiprocessor 1400 to execute the program and perform calculations, shared memory/L1 cache 1418 to communicate between threads, and the load/store unit 1414 to read and write global memory through the shared memory/L1 cache 1418 and the memory partition unit 1300. When configured for general purpose parallel computation, the streaming multiprocessor 1400 can also write commands that the scheduler unit 1112 can use to launch new work on the data processing cluster 1206 modules.

The parallel processing unit 1100 may be included in a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, and the like. In an embodiment, the parallel processing unit 1100 is embodied on a single semiconductor substrate. In another embodiment, the parallel processing unit 1100 is included in a system-on-a-chip (SoC) along with one or more other devices such as additional parallel processing unit 1100 modules, the memory 1104, a reduced instruction set computer (RISC) CPU, a memory management unit (MMU), a digital-to-analog converter (DAC), and the like.

In an embodiment, the parallel processing unit 1100 may be included on a graphics card that includes one or more memory devices. The graphics card may be configured to interface with a PCIe slot on a motherboard of a desktop computer. In yet another embodiment, the parallel processing unit 1100 may be an integrated graphics processing unit (iGPU) or parallel processor included in the chipset of the motherboard.

Exemplary Computing System

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased bandwidth.

Figure 15:
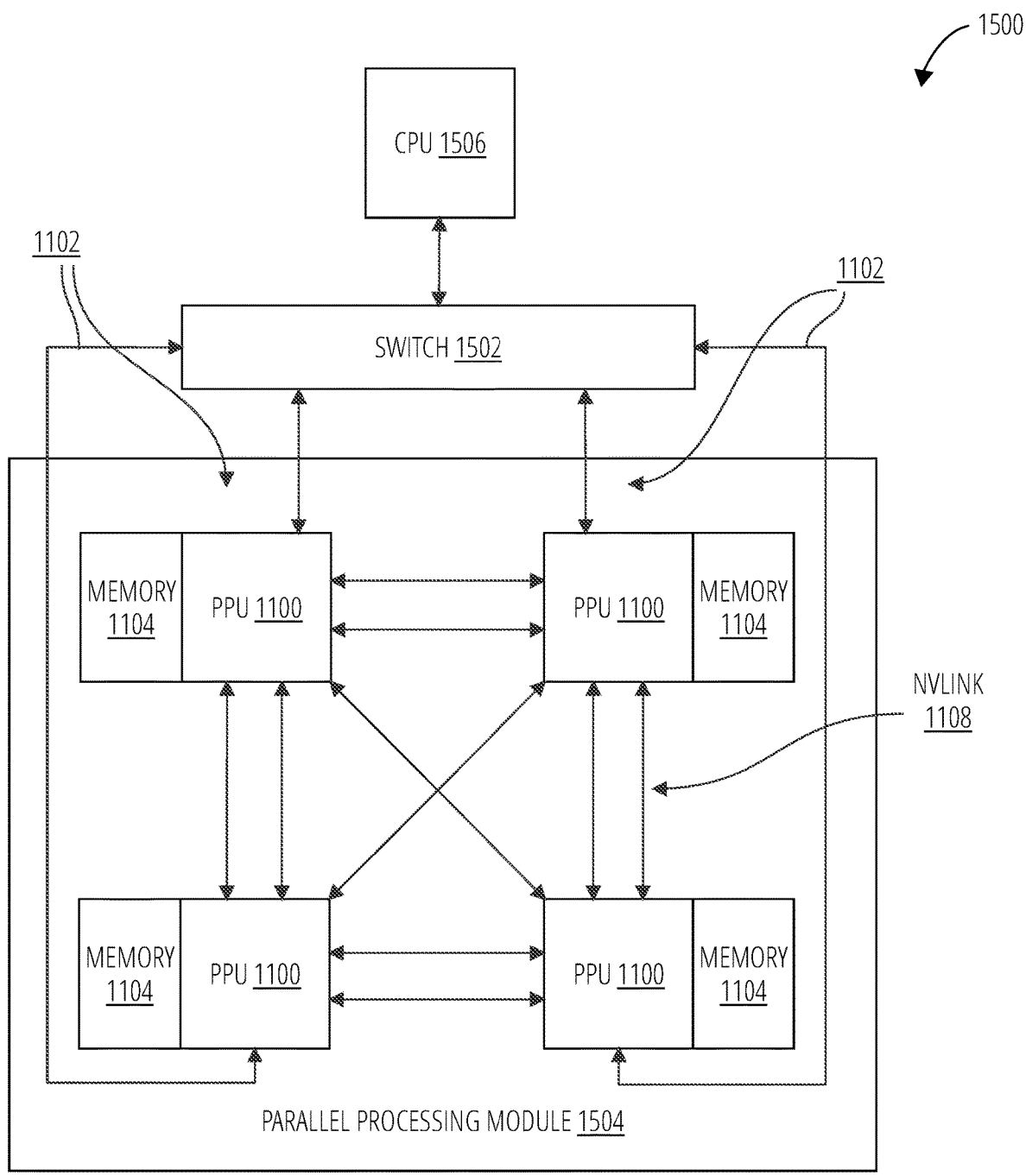
FIG. 15 depicts a processing system 1500 in accordance with one embodiment.

FIG. 15 is a conceptual diagram of a processing system 1500 implemented using the parallel processing unit 1100 of FIG. 11, in accordance with an embodiment. The processing system 1500 includes a central processing unit 1506, switch 1502, and multiple parallel processing unit 1100 modules each and respective memory 1104 modules. The NVLink 1108 provides high-speed communication links between each of the parallel processing unit 1100 modules. Although a particular number of NVLink 1108 and interconnect 1102 connections are illustrated in FIG. 15, the number of connections to each parallel processing unit 1100 and the central processing unit 1506 may vary. The switch 1502 interfaces between the interconnect 1102 and the central processing unit 1506. The parallel processing unit 1100 modules, memory 1104 modules, and NVLink 1108 connections may be situated on a single semiconductor platform to form a parallel processing module 1504. In an embodiment, the switch 1502 supports two or more protocols to interface between various different connections and/or links.

In another embodiment (not shown), the NVLink 1108 provides one or more high-speed communication links between each of the parallel processing unit 1100 modules and the central processing unit 1506 and the switch 1502 interfaces between the interconnect 1102 and each of the parallel processing unit 1100 modules. The parallel processing unit 1100 modules, memory 1104 modules, and interconnect 1102 may be situated on a single semiconductor platform to form a parallel processing module 1504. In yet another embodiment (not shown), the interconnect 1102 provides one or more communication links between each of the parallel processing unit 1100 modules and the central processing unit 1506 and the switch 1502 interfaces between each of the parallel processing unit 1100 modules using the NVLink 1108 to provide one or more high-speed communication links between the parallel processing unit 1100 modules. In another embodiment (not shown), the NVLink 1108 provides one or more high-speed communication links between the parallel processing unit 1100 modules and the central processing unit 1506 through the switch 1502. In yet another embodiment (not shown), the interconnect 1102 provides one or more communication links between each of the parallel processing unit 1100 modules directly. One or more of the NVLink 1108 high-speed communication links may be implemented as a physical NVLink interconnect or either an on-chip or on-die interconnect using the same protocol as the NVLink 1108.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 1504 may be implemented as a circuit board substrate and each of the parallel processing unit 1100 modules and/or memory 1104 modules may be packaged devices. In an embodiment, the central processing unit 1506, switch 1502, and the parallel processing module 1504 are situated on a single semiconductor platform.

In an embodiment, the signaling rate of each NVLink 1108 is 20 to 25 Gigabits/second and each parallel processing unit 1100 includes six NVLink 1108 interfaces (as shown in FIG. 15, five NVLink 1108 interfaces are included for each parallel processing unit 1100). Each NVLink 1108 provides a data transfer rate of 25 Gigabytes/second in each direction, with six links providing 300 Gigabytes/second. The NVLink 1108 can be used exclusively for PPU-to-PPU communication as shown in FIG. 15, or some combination of PPU-to-PPU and PPU-to-CPU, when the central processing unit 1506 also includes one or more NVLink 1108 interfaces.

In an embodiment, the NVLink 1108 allows direct load/store/atomic access from the central processing unit 1506 to each parallel processing unit 1100 module's memory 1104. In an embodiment, the NVLink 1108 supports coherency operations, allowing data read from the memory 1104 modules to be stored in the cache hierarchy of the central processing unit 1506, reducing cache access latency for the central processing unit 1506. In an embodiment, the NVLink 1108 includes support for Address Translation Services (ATS), allowing the parallel processing unit 1100 to directly access page tables within the central processing unit 1506. One or more of the NVLink 1108 may also be configured to operate in a low-power mode.

Figure 16:
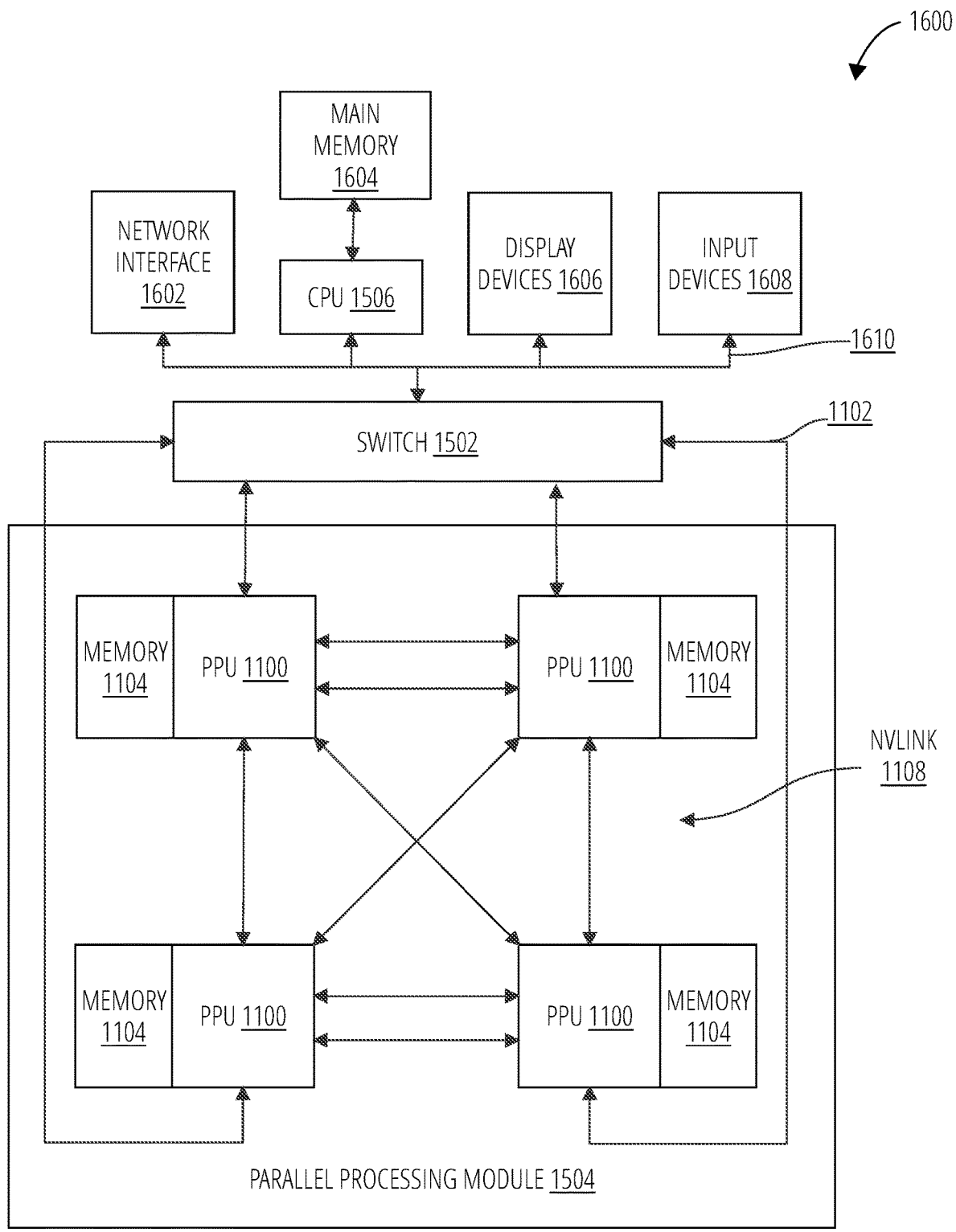
FIG. 16 depicts an exemplary processing system 1600 in accordance with another embodiment.

FIG. 16 depicts an exemplary processing system 1600 in which the various architecture and/or functionality of the various previous embodiments may be implemented. As shown, an exemplary processing system 1600 is provided including at least one central processing unit 1506 that is connected to a communications bus 1610. The communication communications bus 1610 may be implemented using any suitable protocol, such as PCI (Peripheral Component Interconnect), PCI-Express, AGP (Accelerated Graphics Port), HyperTransport, or any other bus or point-to-point communication protocol(s). The exemplary processing system 1600 also includes a main memory 1604. Control logic (software) and data are stored in the main memory 1604 which may take the form of random access memory (RAM).

The exemplary processing system 1600 also includes input devices 1608, the parallel processing module 1504, and display devices 1606, e.g., a conventional CRT (cathode ray tube), LCD (liquid crystal display), LED (light emitting diode), plasma display or the like. User input may be received from the input devices 1608, e.g., keyboard, mouse, touchpad, microphone, and the like. Each of the foregoing modules and/or devices may even be situated on a single semiconductor platform to form the exemplary processing system 1600. Alternately, the various modules may also be situated separately or in various combinations of semiconductor platforms per the desires of the user.

Further, the exemplary processing system 1600 may be coupled to a network (e.g., a telecommunications network, local area network (LAN), wireless network, wide area network (WAN) such as the Internet, peer-to-peer network, cable network, or the like) through a network interface 1602 for communication purposes.

The exemplary processing system 1600 may also include a secondary storage (not shown). The secondary storage includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 1604 and/or the secondary storage. Such computer programs, when executed, enable the exemplary processing system 1600 to perform various functions such as the graph neural network embedding algorithm 500 and ensemble modeling algorithm 900. The main memory 1604, the storage, and/or any other storage are possible examples of computer-readable media.

The architecture and/or functionality of the various previous figures may be implemented in the context of a general computer system, a circuit board system, a game console system dedicated for entertainment purposes, an application-specific system, and/or any other desired system. For example, the exemplary processing system 1600 may take the form of a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, a mobile phone device, a television, workstation, game consoles, embedded system, and/or any other type of logic.

While various embodiments have been described above, it should be understood that they have been presented by way of example, and not limitation. Thus, the breadth and scope of a preferred embodiment should not be limited by any of the above-described exemplary embodiments but should be defined only in accordance with the following claims and their equivalents.

Graphics Processing Pipeline

FIG. 16 is a conceptual diagram of a graphics processing pipeline 1700 implemented by the parallel processing unit 1100 of FIG. 11, in accordance with an embodiment. In an embodiment, the parallel processing unit 1100 comprises a graphics processing unit (GPU). The parallel processing unit 1100 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The parallel processing unit 1100 can be configured to process the graphics primitives to generate a frame buffer (e.g., pixel data for each of the pixels of the display).

An application writes model data for a scene (e.g., a collection of vertices and attributes) to a memory such as a system memory or memory 1104. The model data defines each of the objects that may be visible on a display. The application then makes an API call to the driver kernel that requests the model data to be rendered and displayed. The driver kernel reads the model data and writes commands to the one or more streams to perform operations to process the model data. The commands may reference different shader programs to be implemented on the streaming multiprocessor 1400 modules of the parallel processing unit 1100 including one or more of a vertex shader, hull shader, domain shader, geometry shader, and a pixel shader. For example, one or more of the streaming multiprocessor 1400 modules may be configured to execute a vertex shader program that processes a number of vertices defined by the model data. In an embodiment, the different streaming multiprocessor 1400 modules may be configured to execute different shader programs concurrently. For example, a first subset of streaming multiprocessor 1400 modules may be configured to execute a vertex shader program while a second subset of streaming multiprocessor 1400 modules may be configured to execute a pixel shader program. The first subset of streaming multiprocessor 1400 modules processes vertex data to produce processed vertex data and writes the processed vertex data to the level two cache 1304 and/or the memory 1104. After the processed vertex data is rasterized (e.g., transformed from three-dimensional data into two-dimensional data in screen space) to produce fragment data, the second subset of streaming multiprocessor 1400 modules executes a pixel shader to produce processed fragment data, which is then blended with other processed fragment data and written to the frame buffer in memory 1104. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

The graphics processing pipeline 1700 is an abstract flow diagram of the processing steps implemented to generate 2D computer-generated images from 3D geometry data. As is well-known, pipeline architectures may perform long latency operations more efficiently by splitting up the operation into a plurality of stages, where the output of each stage is coupled to the input of the next successive stage. Thus, the graphics processing pipeline 1700 receives input data 601 that is transmitted from one stage to the next stage of the graphics processing pipeline 1700 to generate output data 1704. In an embodiment, the graphics processing pipeline 1700 may represent a graphics processing pipeline defined by the OpenGL® API. As an option, the graphics processing pipeline 1700 may be implemented in the context of the functionality and architecture of the previous Figures and/or any subsequent Figure(s).

Figure 17:
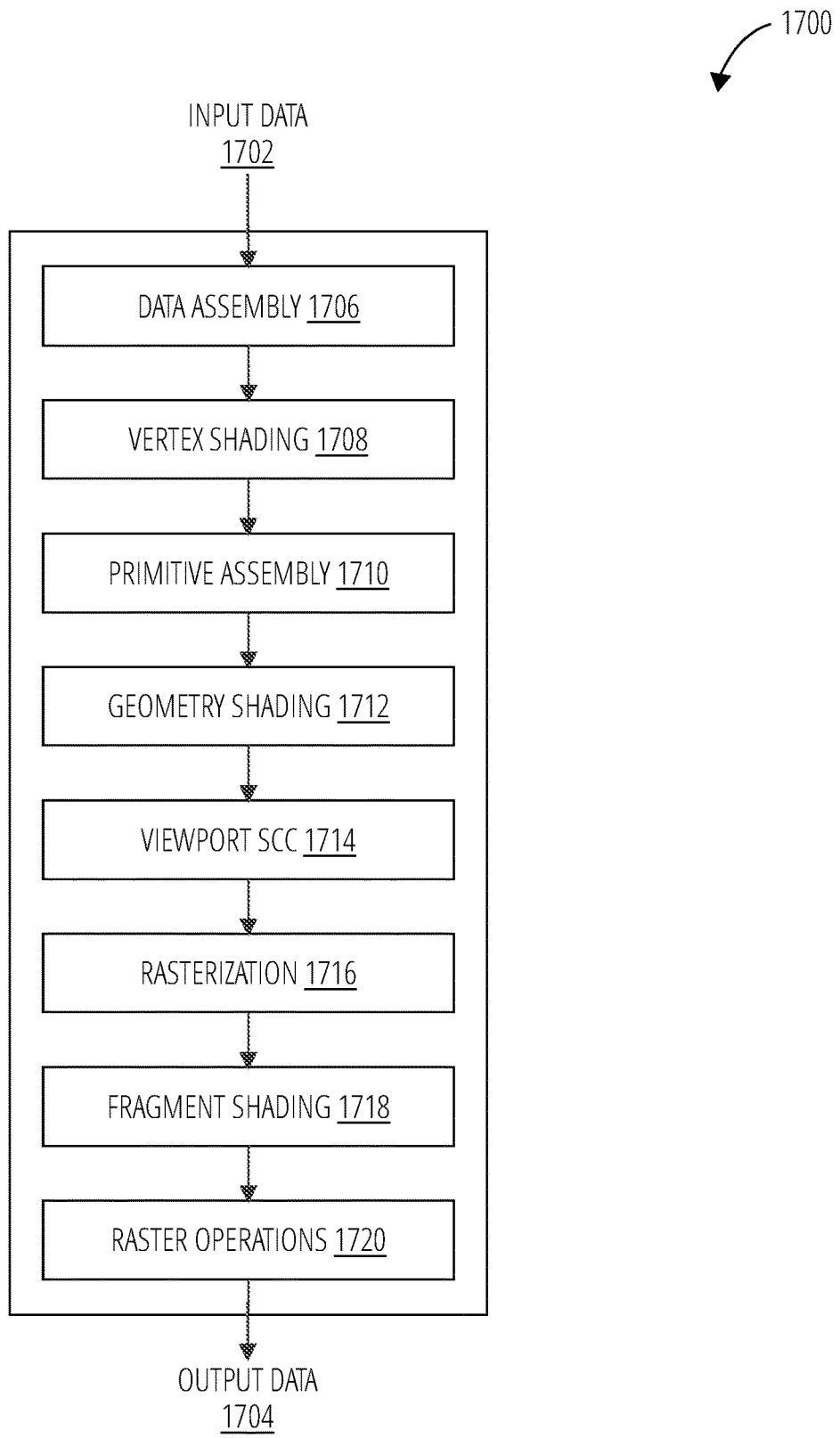
FIG. 17 depicts a graphics processing pipeline 1700 in accordance with one embodiment.

As shown in FIG. 17, the graphics processing pipeline 1700 comprises a pipeline architecture that includes a number of stages. The stages include, but are not limited to, a data assembly 1706 stage, a vertex shading 1708 stage, a primitive assembly 1710 stage, a geometry shading 1712 stage, a viewport SCC 1714 stage, a rasterization 1716 stage, a fragment shading 1718 stage, and a raster operations 1720 stage. In an embodiment, the input data 1702 comprises commands that configure the processing units to implement the stages of the graphics processing pipeline 1700 and geometric primitives (e.g., points, lines, triangles, quads, triangle strips or fans, etc.) to be processed by the stages. The output data 1704 may comprise pixel data (e.g., color data) that is copied into a frame buffer or other type of surface data structure in a memory.

The data assembly 1706 stage receives the input data 1702 that specifies vertex data for high-order surfaces, primitives, or the like. The data assembly 1706 stage collects the vertex data in a temporary storage or queue, such as by receiving a command from the host processor that includes a pointer to a buffer in memory and reading the vertex data from the buffer. The vertex data is then transmitted to the vertex shading 1708 stage for processing.

The vertex shading 1708 stage processes vertex data by performing a set of operations (e.g., a vertex shader or a program) once for each of the vertices. Vertices may be, e.g., specified as a 4-coordinate vector (e.g., <x, y, z, w>) associated with one or more vertex attributes (e.g., color, texture coordinates, surface normal, etc.). The vertex shading 1708 stage may manipulate individual vertex attributes such as position, color, texture coordinates, and the like. In other words, the vertex shading 1708 stage performs operations on the vertex coordinates or other vertex attributes associated with a vertex. Such operations commonly including lighting operations (e.g., modifying color attributes for a vertex) and transformation operations (e.g., modifying the coordinate space for a vertex). For example, vertices may be specified using coordinates in an object-coordinate space, which are transformed by multiplying the coordinates by a matrix that translates the coordinates from the object-coordinate space into a world space or a normalized-device-coordinate (NCD) space. The vertex shading 1708 stage generates transformed vertex data that is transmitted to the primitive assembly 1710 stage.

The primitive assembly 1710 stage collects vertices output by the vertex shading 1708 stage and groups the vertices into geometric primitives for processing by the geometry shading 1712 stage. For example, the primitive assembly 1710 stage may be configured to group every three consecutive vertices as a geometric primitive (e.g., a triangle) for transmission to the geometry shading 1712 stage. In some embodiments, specific vertices may be reused for consecutive geometric primitives (e.g., two consecutive triangles in a triangle strip may share two vertices). The primitive assembly 1710 stage transmits geometric primitives (e.g., a collection of associated vertices) to the geometry shading 1712 stage.

The geometry shading 1712 stage processes geometric primitives by performing a set of operations (e.g., a geometry shader or program) on the geometric primitives. Tessellation operations may generate one or more geometric primitives from each geometric primitive. In other words, the geometry shading 1712 stage may subdivide each geometric primitive into a finer mesh of two or more geometric primitives for processing by the rest of the graphics processing pipeline 1700. The geometry shading 1712 stage transmits geometric primitives to the viewport SCC 1714 stage.

In an embodiment, the graphics processing pipeline 1700 may operate within a streaming multiprocessor and the vertex shading 1708 stage, the primitive assembly 1710 stage, the geometry shading 1712 stage, the fragment shading 1718 stage, and/or hardware/software associated therewith, may sequentially perform processing operations. Once the sequential processing operations are complete, in an embodiment, the viewport SCC 1714 stage may utilize the data. In an embodiment, primitive data processed by one or more of the stages in the graphics processing pipeline 1700 may be written to a cache (e.g., L1 cache, a vertex cache, etc.). In this case, in an embodiment, the viewport SCC 1714 stage may access the data in the cache. In an embodiment, the viewport SCC 1714 stage and the rasterization 1716 stage are implemented as fixed function circuitry.

The viewport SCC 1714 stage performs viewport scaling, culling, and clipping of the geometric primitives. Each surface being rendered to is associated with an abstract camera position. The camera position represents a location of a viewer looking at the scene and defines a viewing frustum that encloses the objects of the scene. The viewing frustum may include a viewing plane, a rear plane, and four clipping planes. Any geometric primitive entirely outside of the viewing frustum may be culled (e.g., discarded) because the geometric primitive will not contribute to the final rendered scene. Any geometric primitive that is partially inside the viewing frustum and partially outside the viewing frustum may be clipped (e.g., transformed into a new geometric primitive that is enclosed within the viewing frustum. Furthermore, geometric primitives may each be scaled based on a depth of the viewing frustum. All potentially visible geometric primitives are then transmitted to the rasterization 1716 stage.

The rasterization 1716 stage converts the 3D geometric primitives into 2D fragments (e.g., capable of being utilized for display, etc.). The rasterization 1716 stage may be configured to utilize the vertices of the geometric primitives to setup a set of plane equations from which various attributes can be interpolated. The rasterization 1716 stage may also compute a coverage mask for a plurality of pixels that indicates whether one or more sample locations for the pixel intercept the geometric primitive. In an embodiment, z-testing may also be performed to determine if the geometric primitive is occluded by other geometric primitives that have already been rasterized. The rasterization 1716 stage generates fragment data (e.g., interpolated vertex attributes associated with a particular sample location for each covered pixel) that are transmitted to the fragment shading 1718 stage.

The fragment shading 1718 stage processes fragment data by performing a set of operations (e.g., a fragment shader or a program) on each of the fragments. The fragment shading 1718 stage may generate pixel data (e.g., color values) for the fragment such as by performing lighting operations or sampling texture maps using interpolated texture coordinates for the fragment. The fragment shading 1718 stage generates pixel data that is transmitted to the raster operations 1720 stage.

The raster operations 1720 stage may perform various operations on the pixel data such as performing alpha tests, stencil tests, and blending the pixel data with other pixel data corresponding to other fragments associated with the pixel. When the raster operations 1720 stage has finished processing the pixel data (e.g., the output data 1704), the pixel data may be written to a render target such as a frame buffer, a color buffer, or the like.

It will be appreciated that one or more additional stages may be included in the graphics processing pipeline 1700 in addition to or in lieu of one or more of the stages described above. Various implementations of the abstract graphics processing pipeline may implement different stages. Furthermore, one or more of the stages described above may be excluded from the graphics processing pipeline in some embodiments (such as the geometry shading 1712 stage). Other types of graphics processing pipelines are contemplated as being within the scope of the present disclosure. Furthermore, any of the stages of the graphics processing pipeline 1700 may be implemented by one or more dedicated hardware units within a graphics processor such as parallel processing unit 1100. Other stages of the graphics processing pipeline 1700 may be implemented by programmable hardware units such as the streaming multiprocessor 1400 of the parallel processing unit 1100.

The graphics processing pipeline 1700 may be implemented via an application executed by a host processor, such as a CPU. In an embodiment, a device driver may implement an application programming interface (API) that defines various functions that can be utilized by an application in order to generate graphical data for display. The device driver is a software program that includes a plurality of instructions that control the operation of the parallel processing unit 1100. The API provides an abstraction for a programmer that lets a programmer utilize specialized graphics hardware, such as the parallel processing unit 1100, to generate the graphical data without requiring the programmer to utilize the specific instruction set for the parallel processing unit 1100. The application may include an API call that is routed to the device driver for the parallel processing unit 1100. The device driver interprets the API call and performs various operations to respond to the API call. In some instances, the device driver may perform operations by executing instructions on the CPU. In other instances, the device driver may perform operations, at least in part, by launching operations on the parallel processing unit 1100 utilizing an input/output interface between the CPU and the parallel processing unit 1100. In an embodiment, the device driver is configured to implement the graphics processing pipeline 1700 utilizing the hardware of the parallel processing unit 1100.

Various programs may be executed within the parallel processing unit 1100 in order to implement the various stages of the graphics processing pipeline 1700. For example, the device driver may launch a kernel on the parallel processing unit 1100 to perform the vertex shading 1708 stage on one streaming multiprocessor 1400 (or multiple streaming multiprocessor 1400 modules). The device driver (or the initial kernel executed by the parallel processing unit 1100) may also launch other kernels on the parallel processing unit 1100 to perform other stages of the graphics processing pipeline 1700, such as the geometry shading 1712 stage and the fragment shading 1718 stage. In addition, some of the stages of the graphics processing pipeline 1700 may be implemented on fixed unit hardware such as a rasterizer or a data assembler implemented within the parallel processing unit 1100. It will be appreciated that results from one kernel may be processed by one or more intervening fixed function hardware units before being processed by a subsequent kernel on a streaming multiprocessor 1400.

Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on. "Logic" refers to machine memory circuits, non transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

Having thus described illustrative embodiments in detail, it will be apparent that modifications and variations are possible without departing from the scope of the disclosed solution as claimed. The scope of the disclosed subject matter is not limited to the depicted embodiments but is rather set forth in the following Claims.

What is claimed is:

1. A system comprising:
   graph generation logic to transform a circuit schematic into a graph;
   a first graph neural network;
   embedding logic to generate a node embedding for the graph by concatenating previously generated node embeddings with aggregated neighbor embeddings, and to group different edge types of the graph independently for processing by attention layers during aggregation of the neighbor embeddings;
   a second graph neural network;
   the second graph neural network trained to output a wider range of parasitic prediction values for the circuit schematic than the first graph neural network; and
   a plurality of different self-attention layers corresponding to groups of different edge types.

2. The system of claim 1, wherein the parasitic prediction values are capacitive parasitic predictions.

3. A system comprising:
   logic to transform a circuit schematic into a heterogeneous graph;
   the heterogeneous graph comprising device nodes representing devices in the circuit schematic and net nodes representing nets in the circuit schematic;
   a plurality of graph neural networks each trained to transform the heterogeneous graph into a range of parasitic prediction values for the circuit schematic between a common base level and a different maximum level; and
   a circuit schematic simulator configured to receive the parasitic predictions and the device parameter predictions from the graph neural networks.

4. The system of claim 3, wherein the parasitic predictions are parasitic capacitance predictions.

5. The system of claim 3, further comprising:
   the graph neural networks further configured to transform edges the graph into parasitic resistance predictions.

6. The system of claim 3, wherein:
   the device nodes comprise transistor device nodes; and
   the heterogeneous graph comprises a plurality of heterogeneous edge types between the transistor device nodes and the net nodes.

7. The system of claim 6, wherein:
   the heterogeneous edge types comprise net to transistor drain edges, net to transistor gate edges, transistor drain to net edges, and transistor gate to net edges.

8. The system of claim 3, wherein:
   the heterogeneous graph excludes edges between device nodes and power rails and device nodes and ground rails.

9. The system of claim 3, wherein:
   the graph neural networks are further configured to:
      sum vectors for groups of multiple edges of the heterogeneous graph into individually weighted vectors;
      apply a self-attention layer separately to the individually weighted vectors for each group;
      combine outputs of the self-attention layers for groups representing a same edge type into an output vector; and
      sum the output vectors into a unified vector.

10. The system of claim 9, wherein:
    the graph neural networks each form a node embedding for a next network layer by applying weights of the next layer to the unified vector.

11. A method comprising:
    providing a circuit schematic as a heterogeneous graph input to a plurality of graph neural networks, each of the graph neural networks generating a different range of parasitic prediction values for the circuit schematic;

generating device node embeddings for the graph using a plurality of aggregation and attention layers;

generating net node embeddings for the graph using the plurality of aggregation and attention layers; and wherein the attention layers are self-attention layers assigned to process different types of heterogeneous net nodes.

12. The method of claim 11, wherein each range has a common base level.

13. The method of claim 11, wherein the parasitic predictions are parasitic capacitance predictions.

14. The method of claim 11, further comprising:
the graph neural networks transforming edges the graph into parasitic resistance predictions.

15. The method of claim 11, wherein:
the device nodes comprise transistor device nodes; and
the heterogeneous graph comprises a plurality of heterogeneous edge types between the transistor device nodes and the net nodes.

16. The method of claim 15, wherein:
the heterogeneous edge types comprise net to transistor drain edges, net to transistor gate edges, transistor drain to net edges, and transistor gate to net edges.

17. The method of claim 11, wherein:
the graph neural networks further configured to:
sum vectors for groups of multiple edges of the heterogeneous graph into individually weighted vectors;

apply a self-attention layer separately to the individually weighted vectors for each group;

combine outputs of the self-attention layers for groups representing a same edge type into an output vector; and sum the output vectors into a unified vector.

* * * * *